United States Patent
Negishi

(10) Patent No.: US 9,356,080 B2
(45) Date of Patent: May 31, 2016

(54) ORGANIC EL DISPLAY DEVICE AND ELECTRONIC APPARATUS

(71) Applicant: JOLED Inc., Tokyo (JP)

(72) Inventor: Eisuke Negishi, Tokyo (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/640,567

(22) Filed: Mar. 6, 2015

(65) Prior Publication Data

US 2015/0279912 A1  Oct. 1, 2015

(51) Int. Cl.
*H01L 27/32* (2006.01)
*H01L 51/52* (2006.01)

(52) U.S. Cl.
CPC ........ *H01L 27/3246* (2013.01); *H01L 27/3213* (2013.01); *H01L 27/3258* (2013.01); *H01L 27/3276* (2013.01); *H01L 51/5246* (2013.01)

(58) Field of Classification Search
CPC .................. H01L 27/3246; H01L 27/3213
See application file for complete search history.

(56) References Cited

U.S. PATENT DOCUMENTS

| | | | |
|---|---|---|---|
| 9,111,882 B1* | 8/2015 | Chen | H01L 27/322 |
| 2011/0108877 A1* | 5/2011 | Yamada | H01L 27/3244 257/99 |
| 2012/0062107 A1* | 3/2012 | Fujimura | H05B 33/04 313/504 |

FOREIGN PATENT DOCUMENTS

JP  2002-093576 A  3/2002

* cited by examiner

*Primary Examiner* — Mamadou Diallo
(74) *Attorney, Agent, or Firm* — Michael Best & Friedrich LLP

(57) ABSTRACT

An organic EL display device includes a display region where a plurality of pixels having a light-emitting device stacked in order of an organic layer including a first electrode and a light-emitting layer, and a second electrode from a substrate, are arranged, a peripheral region having a peripheral circuit that is arranged on an outer edge side of the display region, a lower layer-sided first insulating layer and an upper layer-sided second insulating layer that are arranged to be extended to the peripheral region from the display region, a first separation groove that is arranged in the first insulating layer between the display region and the peripheral region, a first conductive layer that is arranged on the first insulating layer of the peripheral region, a first covering portion, a sealing portion that is arranged on an outer edge side of the first covering portion, and a second covering portion.

20 Claims, 16 Drawing Sheets

ORGANIC EL DISPLAY DEVICE AND ELECTRONIC APPARATUS

CROSS REFERENCE TO RELATED APPLICATIONS

This application claims the benefit of Japanese Priority Patent Application JP 2014-064423 filed Mar. 26, 2014, the entire contents of which are incorporated herein by reference.

BACKGROUND

The present disclosure relates to an organic EL display device which emits light using an organic electro luminescence (EL) phenomenon, and an electronic apparatus including the organic EL display device.

An organic EL device which emits light using an EL phenomenon of an organic material, is configured to arrange an organic layer by stacking an organic positive hole transport layer and an organic light-emitting layer between an anode and a cathode, and is attracted attention as a light-emitting device which can emit the light at high luminance by a low voltage direct current drive. However, a display device (organic EL display device) using the organic EL device, has problems that time-dependent stability is low and a lifespan is short, such that deterioration of the organic layers due to moisture absorption is generated in the organic EL device, the light-emitting luminance is lowered, or the emitting of the light is unstable in the organic EL device.

For example, in Japanese Unexamined Patent Application Publication No. 2002-93576, it is proposed an organic EL display device in which a cover material for sealing is placed on a device formation face side where the organic EL device and other circuits are formed in a substrate, and a peripheral portion of the substrate and the cover material is sealed by a seal material. Additionally, in Japanese Unexamined Patent Application Publication No. 2002-93576, it is proposed a configuration of covering an outside of the seal material by a hard carbon film as a protective film for preventing infiltration of water vapor or the like. By such the configuration, the organic EL device which is formed on the substrate is totally blocked from the outside, and it is possible to prevent a material such as moisture or oxygen which promotes the deterioration due to oxidation of the organic EL device from being infiltrated from the outside.

In addition thereto, it is proposed a total solid type organic EL display device in which the cover material for sealing is bonded to the device formation face side where the organic EL device and other circuits are formed in the substrate, through an adhesive agent.

SUMMARY

In the organic EL display device, generally, an interlayer insulating layer is arranged in a state of covering a drive circuit which is configured using a thin film transistor (TFT), and the organic EL devices are configured to form an array on the interlayer insulating layer. In this case, in order to form the organic EL device on a face that is flattened by reducing a level difference which is generated due to the formation of the drive circuit, for example, the interlayer insulating layer is formed of a flattening film using an organic photosensitive insulating layer or the like. However, since the interlayer insulating layer (organic insulating layer) which is made up of the organic material is likely to pass the moisture, the moisture is infiltrated from a cross section of the interlayer insulating layer which is exposed to the atmosphere, and there is a problem of deteriorating the organic EL device.

In order to solve the problems, it is proposed an organic EL display device in which a separation groove that separates the organic insulating layer described above from an inner region side thereof and an outer region side thereof is formed in a position (outer edge side of a display region) surrounding the display region (for example, see Japanese Unexamined Patent Application Publication No. 2006-54111 and Japanese Unexamined Patent Application Publication No. 2008-283222). By arranging the separation groove, the moisture which is present on the outer region side in the organic insulating layer, is avoided from infiltrating the inner region side (display region side) by passing through an inside of the organic insulating layer. Consequently, as described above, it is possible to suppress the deterioration of the organic layer (organic EL device) which is caused by that the moisture left behind in the display device passes through the organic insulating layer.

However, in a structure which is proposed in Japanese Unexamined Patent Application Publication No. 2006-54111 and Japanese Unexamined Patent Application Publication No. 2008-283222, for example, when an area mask is used at the time of forming a film with the organic layer such as a white organic EL device, since the following problems are generated, there is a room for improvement. That is, in this case, in consideration of an alignment shift (mask shift region) of the area mask and wraparound (taper region) of the film, the separation groove is necessary to be formed in the position which is sufficiently distant from the display region, in actuality. Hence, a necessity to widen a frame is generated (necessity to widen a distance between the display region and a peripheral region is generated), and it is difficult to achieve frame narrowing (size reduction of the display device, and cost reduction). Additionally, since the necessity to widen the distance between the display region and the peripheral region is generated, the moisture which is included within the organic insulating layer infiltrates the organic layer in the region (inner region of the separation groove), and thereby, the organic layer deteriorates.

It is desirable to provide an organic EL display device which is capable of improving reliability of an organic EL device while achieving frame narrowing, and an electronic apparatus including the organic EL display device.

An organic EL display device according to an embodiment of the present disclosure, includes a display region where a plurality of pixels having a light-emitting device which is stacked respectively in order of an organic layer including a first electrode and a light-emitting layer, and a second electrode from a substrate side, are arranged, a peripheral region that is arranged on an outer edge side of the display region, and has a peripheral circuit, a first insulating layer of a lower layer side and a second insulating layer of an upper layer side that are arranged so as to be extended to the peripheral region from the display region, a first separation groove that is arranged in the first insulating layer between the display region and the peripheral region, a first conductive layer that is arranged on the first insulating layer of the peripheral region, through a bottom portion from a side face of the first separation groove, a first covering portion where at least an end face of the second insulating layer is covered by the organic layer or the second electrode, a sealing portion that is arranged on an outer edge side of the first covering portion, and is configured by stacking the first conductive layer and the second electrode, and a second covering portion where an end face of an outer edge side of the first insulating layer which is separated from the peripheral region side by the first separation groove, is covered by the first conductive layer.

An electronic apparatus according to another embodiment of the present disclosure, includes the organic EL display device of the present disclosure.

In the organic EL display device and the electronic apparatus according to the embodiments of the present disclosure, the first separation groove that separates the first insulating layer from the display region and the peripheral region, is formed between the display region and the peripheral region. In the peripheral region, the first covering portion where the end face of the second insulating layer is covered by the organic layer or the second electrode, and the sealing portion that is configure by stacking the first conductive layer and the second electrode in the outer edge side than the first covering portion, are arranged. Hereby, the separation groove that separates the first insulating layer and the second insulating layer, is formed in the region of a portion of an outer edge side of a formation region of the organic layer, differently from the related art. Therefore, the moisture which is included within the first insulating layer and the second insulating layer, is avoided from infiltrating the organic layer in the outer edge side (corresponding to the inner region of the separation groove in a case of the related art) of the first separation groove. Moreover, by arranging the second covering portion where the end face of the outer edge side of the first insulating layer which is separated by the first separation groove is covered by the first conductive layer, at the further outer edge, the infiltration of the moisture to the organic layer through the first insulating layer from the outside, is reduced.

According to the organic EL display device and the electronic apparatus of the embodiments of the present disclosure, the first separation groove is arranged in the first insulating layer between the display region and the peripheral region, and the first covering portion where the end face of the second insulating layer is covered by the organic layer or the second electrode, and the sealing portion that is configure by stacking the first conductive layer and the second electrode, are formed in the peripheral region. Hereby, the moisture which is included within the first insulating layer and the second insulating layer on the outer edge side of the first separation groove, can be avoided from infiltrating the organic layer. Furthermore, since the second covering portion where the end face of the outer edge side of the first insulating layer of the peripheral region which is separated by the first separation groove is covered by the first conductive layer is arranged, it is possible to prevent the infiltration of the moisture or the like, to the first insulating layer from the outside. Hereby, it is possible to further reduce the infiltration of the moisture or gas which has a concern of deteriorating the organic layer. Accordingly, it is possible to provide the display device of which the reliability is high by suppressing the deterioration of the organic EL device while achieving the frame narrowing. The effects that are described here, are not necessarily limited, and may be any one of the effects which are described in the present disclosure.

DETAILED DESCRIPTION OF EMBODIMENTS

Hereinafter, embodiments of the present disclosure will be described with reference to the drawings. The description will be performed in the following order.

1. Embodiment (example of arranging first covering portion and second covering portion)
2. Modification Example
    Modification Example 1 (example of arranging metal layer at outer edge than first separation groove)
    Modification Example 2 (example of arranging a plurality of separation grooves in addition to first separation groove)
    Modification Example 3 (example of arranging high resistance layer between organic layer and second electrode)
3. Application Example (application example to electronic apparatus)

1. Embodiment

Overall Configuration Example of Organic EL Display Device

Figure 1:
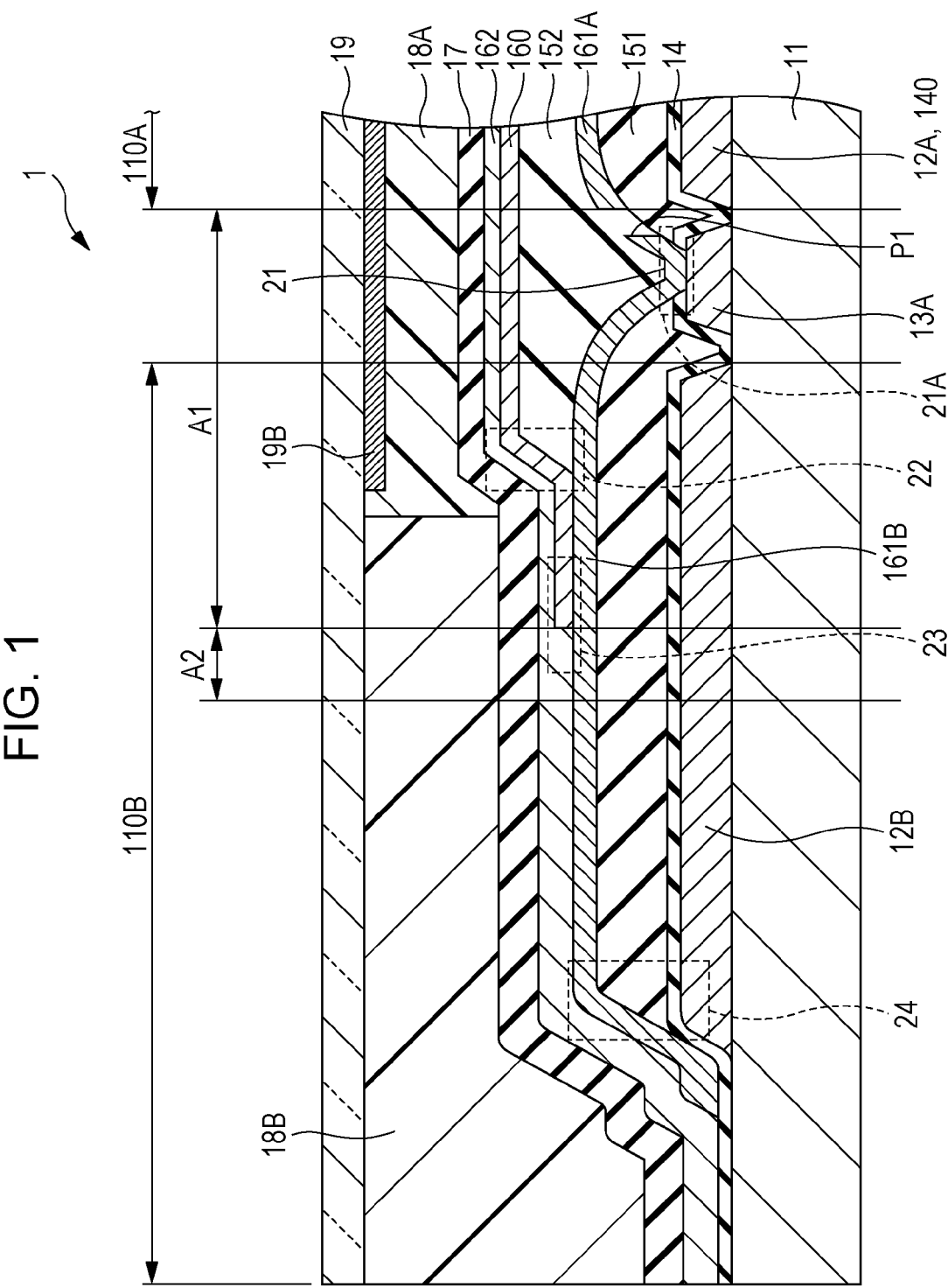
FIG. 1 is a cross-sectional view illustrating a configuration of an organic EL display device according to an embodiment of the present disclosure.
Figure 2:
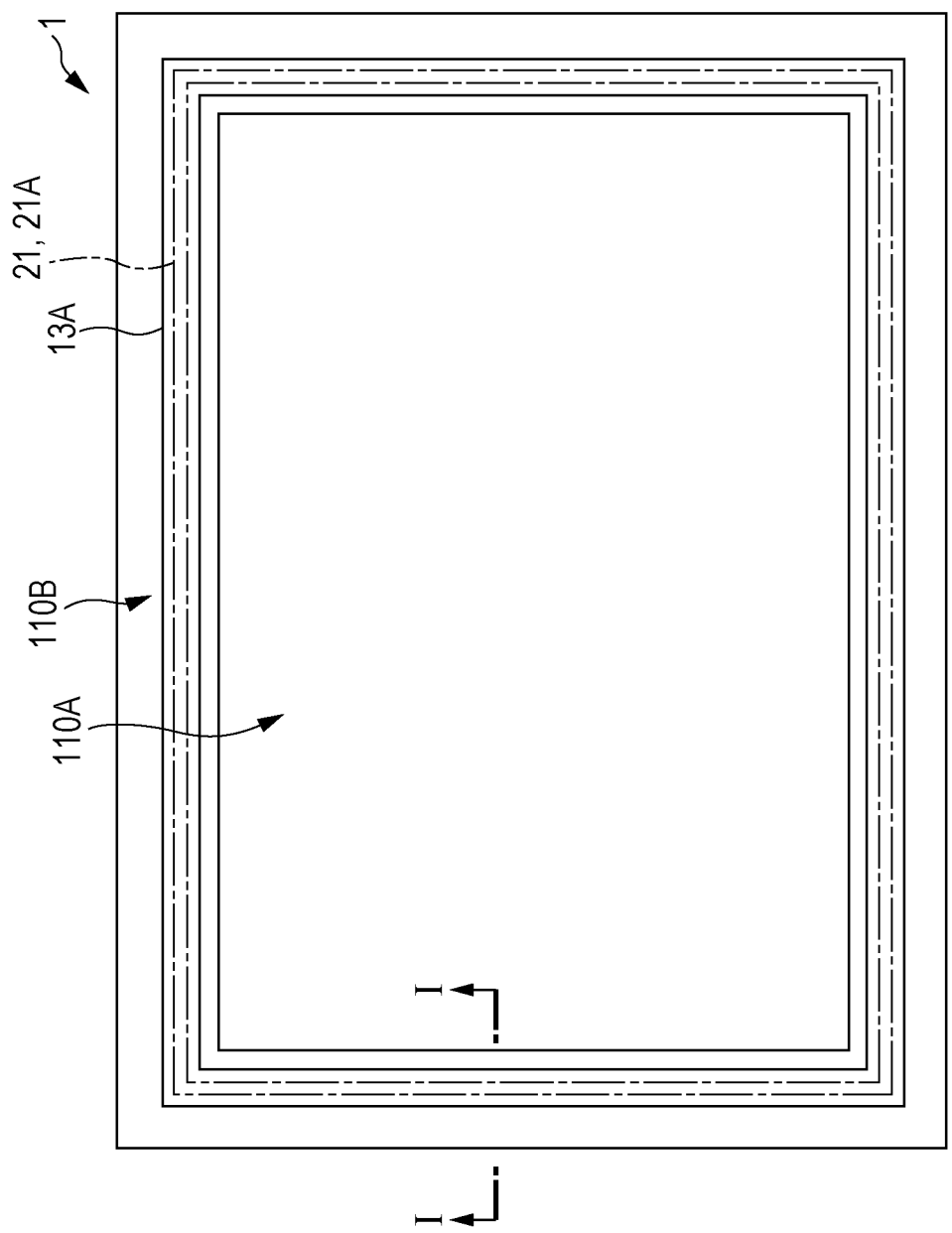
FIG. 2 is a plan view of the organic EL display device shown in FIG. 1.
Figure 3:
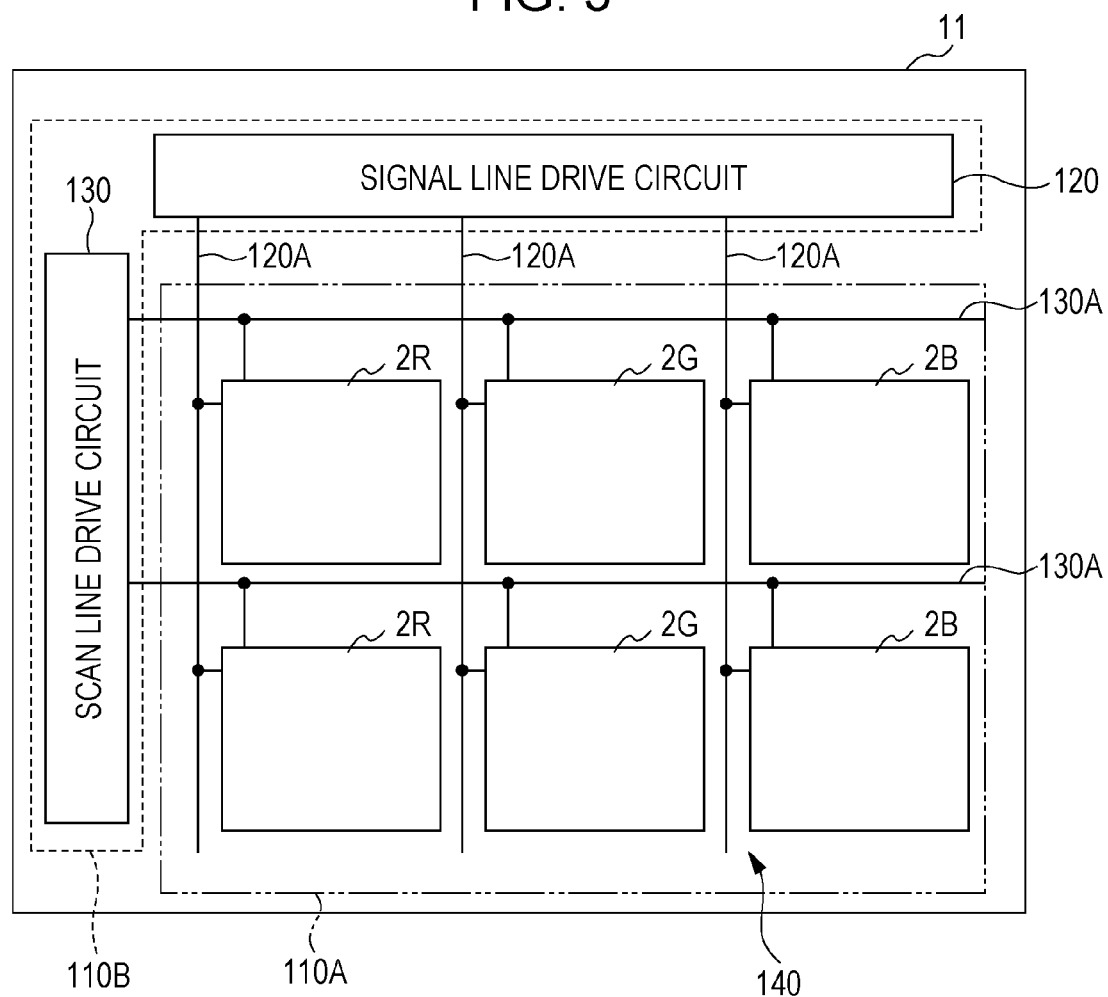
FIG. 3 is a diagram illustrating an overall configuration of the organic EL display device shown in FIG. 1.
Figure 4:
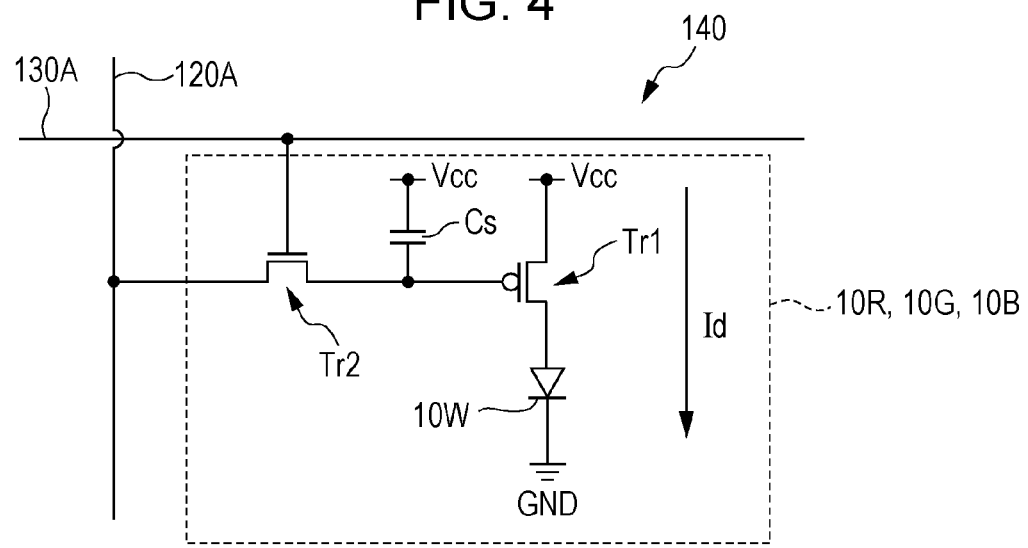
FIG. 4 is a diagram illustrating an example of a pixel drive circuit shown in FIG. 3.

FIG. 1 is a diagram illustrating a cross-sectional configuration of an organic EL display device (organic EL display device 1) according to an embodiment of the present disclosure. The organic EL display device 1 is an device which is used as an organic EL television device or the like. As shown in FIG. 2, on a substrate 11, a display region 110A is arranged, and a peripheral region 110B is arranged in the vicinity of the display region 110A. For example, the organic EL display device 1 is an upper face light-emitting type (so-called top emission type) display device in which any one color light of R (red), G (green), and B (blue) exits from an upper face (opposite face to the substrate 11) side by using a white organic EL device 10W and a color filter 19A described later (see FIG. 5). FIG. 1 is a cross-sectional view of an organic EL display device 1A along an I-I line shown in FIG. 2. FIG. 3 is a diagram illustrating an example of an overall configuration of the organic EL display device 1 shown in FIG. 1, and within the display region 110A, a plurality of pixels 2 (red pixel 2R, green pixel 2G, and blue pixel 2B) are placed in a matrix shape. Moreover, a signal line drive circuit 120 and a scan line drive circuit 130 which are drivers (peripheral circuit 12B described later) for a video display, are arranged in the peripheral region 110B which is positioned in the vicinity (outer edge side and outer periphery side) of the display region 110A.

Within the display region 110A, a pixel drive circuit 140 is arranged. FIG. 3 is a diagram illustrating an example (example of a pixel circuit of the red pixel 2R, the green pixel 2G, and the blue pixel 2B) of the pixel drive circuit 140. The pixel drive circuit 140 is an active type drive circuit which is formed in a lower layer of a lower electrode 161 described later. The pixel drive circuit 140 has a drive transistor Tr1, a write-in transistor Tr2, and a capacitor (storage capacitor) Cs between the transistors Tr1 and Tr2. Moreover, the pixel drive circuit 140 has the white organic EL device 10W which is connected to the drive transistor Tr1 in series, between a first power supply line (Vcc) and a second power supply line (GND). That is, the white organic EL devices 10W are respectively arranged within the red pixel 2R, the green pixel 2G, the blue pixel 2B. The drive transistor Tr1 and the write-in transistor Tr2 are configured by general thin film transistors (TFT). For example, the configuration may be a reverse stagger structure (so-called bottom gate type), or may be a stagger structure (top gate type), and may not be limited in particular.

In the pixel drive circuit 140, a plurality of signal lines 120A are placed in a column direction, and a plurality of scan lines 130A are placed in a row direction. An intersection of each signal line 120A and each scan line 130A corresponds to any one of the red pixel 2R, the green pixel 2G, and the blue pixel 2B. Each signal line 120A is connected to the signal line drive circuit 120, and an image signal is supplied to a source electrode of the write-in transistor Tr2, through the signal line 120A from the signal line drive circuit 120. Each scan line 130A is connected to the scan line drive circuit 130, and a scan signal is sequentially supplied to a gate electrode of the write-in transistor Tr2, through the scan line 130A from the scan line drive circuit 130.

As shown in FIG. 1, in the organic EL display device 1 of the embodiment, a separation groove 21 (first separation groove) is formed in an organic insulating layer 151 (first insulating layer) between the display region 110A and the peripheral region 110B. Moreover, at an outer edge than the separation groove 21, a covering portion 22 (first covering portion) where an end face of an organic insulating layer 152 which is arranged continually from the display region 110A so as to bury the separation groove 21, is covered by an organic layer 160 described later or an upper electrode 162, and a covering portion 24 (second covering portion) where an end face of an outer edge side of the organic insulating layer 151 which is separated from the peripheral region 110B side by the separation groove 21, is covered by a conductive layer 161B, are arranged. Furthermore, a sealing portion 23 where the conductive layer 161B and the upper electrode 162 are stacked, is arranged between the covering portion 22 and the covering portion 24. The organic layer 160 is formed so as to be extended from the display region 110A to a portion of the peripheral region 110B, on the organic insulating layer 152 and the conductive layer 161B. Specifically, the organic layer 160 is formed from the display region 110A to a taper region A1 shown in FIG. 1, and the covering portion 22 which covers the end face of the organic insulating layer 152, is formed within the taper region A1. Here, the taper region A1 is a wraparound region of a film at the time of forming the organic layer 160, and is a region which is formed at the outer edge (outer periphery) the display region 110A. The organic EL display device 1 has a stacked structure by stacking a wiring layer which is made up of a pixel drive circuit 12A (corresponding to the pixel drive circuit 140), the peripheral circuit 12B, and a metal layer 13A on the substrate 11, an inorganic insulating layer 14, the organic insulating layer 151, a lower electrode 161A (and the conductive layer 161B), the organic insulating layer 152 (second insulating layer), the organic layer 160, the upper electrode 162, a protective layer 17, a filler layer (adhesive layer) 18A, a seal material 18B, a color filter 19A, a BM (black matrix) layer 19B in the order thereof. Additionally, a substrate for sealing 19 is bonded onto the stacked structure, and the stacked structure is sealed.

The separation groove 21 is arranged in the organic insulating layer 151 between the display region 110A and the peripheral region 110B, specifically, in the organic insulating layer 151 of a position corresponding to the metal layer 13A. The separation groove 21 is a groove for separating the organic insulating layer 151 from the display region 110A side and the peripheral region 110B side. In the separation groove 21, a side wall and a bottom face thereof are covered by the lower electrode 161A and the conductive layer 161B. The lower electrode 161A and the conductive layer 161B are conductive layers which are formed by the same process and the same material. For example, the lower electrode 161A and the conductive layer 161B are separated from each other by an opening P1 which is arranged in the side wall of the display region 110A side of the separation groove 21, and an electrically non-conductive state is formed between both regions. Furthermore, in the embodiment, the separation groove 21 passes through the inorganic insulating layer 14, and forms a connection portion (cathode contact 21A described later) where the conductive layer 161B covering a bottom portion of the separation groove 21 is stacked directly to the metal layer 13A. An inner diameter of the separation groove 21 is, for example, approximately 10 μm to 100 μm. A depth of the separation groove 21 is obtained by combining a thickness of the organic insulating layer 151 and the thickness of the inorganic insulating layer 14, and is for example, approximately 500 nm to 5000 nm. When the cathode contact is formed at a spot which is different from the metal layer 13A, the metal layer 13A may be not arranged. In this case, for example, the metal layer 13A in FIG. 1 is removed, and the conductive layer 161B may be formed so as to come into contact directly with the substrate 11. Alternatively, the conductive layer 161B may come into contact with the substrate 11, through the inorganic insulating layer 14.

The covering portion 22 and the covering portion 24 have the configurations as described above. That is, the covering portion 22 has the structure of stacking the conductive layer 161B which is separated from the lower electrode 161A by the opening P1, and the organic layer 160 which is arranged on the organic insulating layer 152, in the end face of the organic insulating layer 152 which is arranged continually from the display region 110A to bury the separation groove 21. Furthermore, the end face of the organic layer 160 is sealed (sealing portion 23) by stacking the conductive layer 161B and the upper electrode 162. Hereby, infiltration of moisture that is included in the organic insulating layer 151 which is separated from the peripheral region 110B side by the separation groove 21 to the organic insulating layer 152 and the organic layer 160, is prevented. Here, the end face of the organic insulating layer 152 is covered by the organic layer 160, but may be covered directly by the upper electrode 162. The covering portion 24 has the structure of stacking the inorganic insulating layer 14 which is arranged in the lower layer of the organic insulating layer 151, and the conductive layer 161B on the organic insulating layer 151. Hereby, the infiltration of the moisture to the organic insulating layer 151 of the peripheral regions 110B side from the outside, is prevented, and the infiltration of the moisture to the organic layer 160, the organic insulating layer 152, and the organic insulating layer 151 of the display region 110A side, can be further prevented.

The substrate 11 is a support where the white organic EL devices 10W are configured to form an array on one main face side thereof. For example, as a substrate 11, quartz, glass, metal foil, a film made of resin, or a sheet made of resin may be used.

The pixel drive circuit 12A and the peripheral circuit 12B are drive circuits (drivers for the video display) which are made up of the signal line drive circuit 120, the scan line drive circuit 130, and the like. The pixel drive circuit 12A and the peripheral circuit 12B are formed on the lower layer side (specifically, between the substrate 11 and the inorganic insulating layer 14) of the organic insulating layer 151, on the substrate 11.

The metal layer 13A is a portion (cathode contact 21A) functioning as a wiring layer with respect to the pixel drive circuit 12A (140) and the peripheral circuit 12B, and functioning as a wiring layer (electrode) for making a contact of the upper electrode 162 described later. For example, the metal layer 13A is made up of a simple substance or an alloy of metallic elements such as aluminum (Al), copper (Cu) and titanium (Ti).

The inorganic insulating layer 14 is formed almost equally on the pixel drive circuit 12A, the peripheral circuit 12B, the metal layer 13A, a metal layer 13B, and the substrate 11. For example, the inorganic insulating layer 14 is made up of an inorganic material such as silicon oxide ($SiO_x$), silicon nitride ($SiN_x$), silicon nitrided oxide ($SiN_xO_y$), titanium oxide ($TiO_x$) or aluminum oxide ($Al_xO_y$).

The organic insulating layers 151 and 152 function as an interpixel insulating layer, respectively, and the organic insulating layer 151 is formed on the lower layer side, and the organic insulating layer 152 is formed on the upper layer side. The organic insulating layer 151 of the lower layer side is formed so as to be extended from the display region 110A to an outer region thereof (for example, an end portion of the substrate 10 through the peripheral region 110B), on the substrate 11. The organic insulating layer 152 of the upper layer side is formed so as to be extended from the display region 110A to the portion (for example, the peripheral region 110B (within the taper region A1) which is close to the display region 110A) of the peripheral region 110B, and the end face thereof is covered by the organic layer 160. For example, the organic insulating layers 151 and 152 are respectively made up of an organic material such as polyimide, acryl, novolac resin or siloxane.

The lower electrode 161A, the organic layer 160, and the upper electrode 162 form the stacked structure configuring the white organic EL device 10W described above.

The lower electrode 161A functions as a positive pole (anode electrode), and is arranged per the pixel 2 (2R, 2G, and 2B) of each color within the display region 110A. Moreover, in the outer region (mainly the peripheral region 110B) of the display region 110A, the lower electrode 161 is formed to be extended, and the conductive layer 161B which is blocked by the opening P1, is almost equally formed. That is, the lower electrode 161A and the conductive layer 161B are formed by the same process and the same material, and for example, are configured by a metal material (for example, aluminum (Al) or a stack of indium tin oxide (ITO) and silver (Ag)) of which light reflectivity is approximately 70% or more.

The organic layer 160 is formed so as to be extended from the display region 110A to the portion of the peripheral region 110B, on the organic insulating layer 152 and the conductive layer 161B. Specifically, the organic layer 160 is formed from the display region 110A to the taper region A1 shown in FIG. 1, and the covering portion 22 which covers the end face of the organic insulating layer 152, is formed within the taper region A1.

Figure 5:
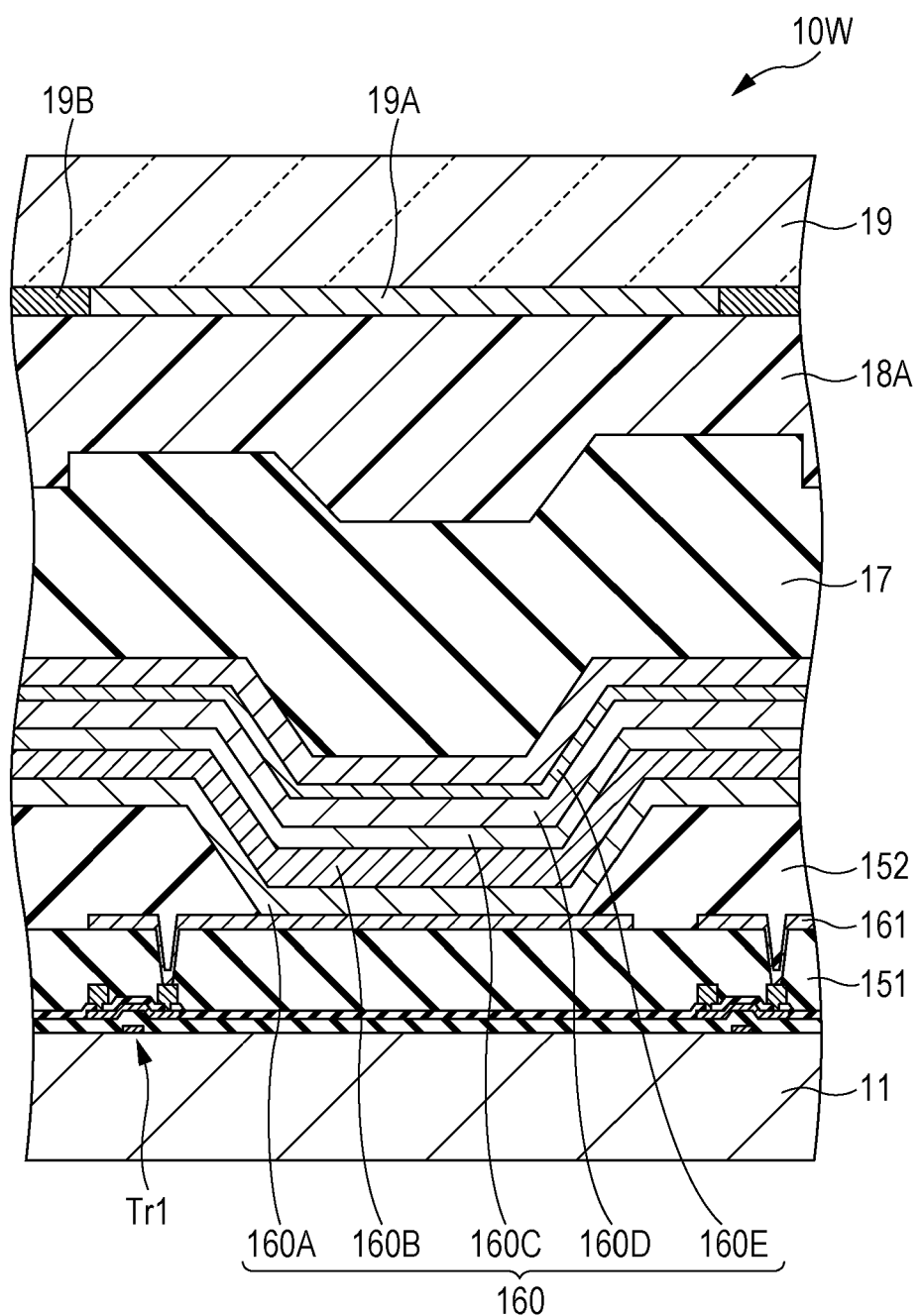
FIG. 5 is a cross-sectional view of an organic EL device configuring the organic EL display device shown in FIG. 1.

As shown in FIG. 5, the organic layer 160 has the stacked structure of stacking a positive hole injection layer 160A, a positive hole transport layer 160B, a light-emitting layer 160C, an electron transport layer 160D, and an electron injection layer 160E in order from the lower electrode 161 side. Among the layers, the layer other than the light-emitting layer 160C, may be arranged as necessary. The positive hole injection layer 160A is arranged in order to enhance positive hole injection efficiency, and to prevent a leakage. The positive hole transport layer 160B is arranged in order to enhance positive hole transport efficiency to the light-emitting layer 160C. The light-emitting layer 160C causes recombination of the electron and the positive hole by spreading an electric field, and generates light. The electron transport layer 160D is arranged in order to enhance electron transport efficiency to the light-emitting layer 160C, and the electron injection layer 160E is arranged in order to enhance electron injection efficiency. Furthermore, a configuration material of the organic layer 160 may be a general low molecular organic material or a general high molecular organic material, and is not limited in particular.

The upper electrode 162 functions as a negative pole (cathode electrode), and is arranged as a common electrode to each pixel 2 within the display region 110A. The upper electrode 162 is made up of a transparent electrode, and for example, it is preferable that the upper electrode 162 is made up of the material such as indium zinc oxide (IZO) or zinc oxide (ZnO). On the substrate 11, the upper electrode 162 is formed so as to be extended from the display region 110A to the outer region thereof (for example, the end portion of the peripheral circuit 12B). Specifically, the upper electrode 162 is formed to be extended from the organic layer 160 which is arranged on the conductive layer 161B through the covering portion 22 covering the end face of the organic insulating layer 152, and the conductive layer 161B and the upper electrode 162 are directly stacked in the extended region, and the sealing portion 23 blocking the organic layer 160 (and the organic insulating layer 152) from the outside air is arranged. Hereby, the infiltration of the moisture to the organic insulating layer 152 and the organic layer 160, is prevented. Furthermore, the organic layer 160 does not necessarily cover the end face of the organic insulating layer 152, and the upper electrode 162 may be configured to directly cover the end face of the organic insulating layer 152.

Moreover, the upper electrode 162 and the conductive layer 161B are directly stacked in the peripheral region 110B, and thereby, the upper electrode 162 and the metal layer 13A are electrically connected through the conductive layer 161B. That is, between the display region 110A and the peripheral region 110B, the separation groove 21 separating the organic insulating layer 151 is formed, and the upper electrode 162 and the metal layer 13A are electrically connected, and the so-called cathode contact 21A is formed. As shown in FIG. 2, the cathode contact 21A is continually arranged so as to surround the separation groove 21 and the display region 110A. In this manner, the cathode contact 21A is arranged so as to surround a display panel (display region 110A), and thereby, it is possible to prevent a concern of lowering luminance at a center portion of the panel at the time of enlargement. Furthermore, the cathode contact 21A is not necessarily arranged continually in the vicinity of the display region 110A, and may be cut in the portion thereof or at a plurality of spots.

The protective layer 17 is formed on the upper electrode 162, and is formed continually to the substrate 11, for example, so as to cover the peripheral circuit 12B, the inorganic insulating layer 14, the organic insulating layer 151, the conductive layer 161B, and the end face of the upper electrode 162. For example, the protective layer 17 is made up of the inorganic material such as silicon oxide ($SiO_x$), silicon nitride ($SiN_x$), silicon nitride oxide ($SiN_xO_y$), titanium oxide ($TiO_x$) or aluminum oxide ($Al_xO_y$).

The filler layer 18A is formed on the protective layer 17, and functions as an adhesive layer. For example, the filler layer 18A is made up of epoxy resin, acryl resin or the like. Moreover, the filler layer 18A may be formed using a sheet shaped resin film. Furthermore, the filler layer 18A is not necessarily arranged, and a portion of the filler layer 18A may be hollow.

The seal material 18B is arranged in the end portion (peripheral portion) of the substrate 11, and is a member for sealing the respective layers between the substrate 11 and the substrate for sealing 19, from the outside. Additionally, for example, the seal material 18B is made up of epoxy resin, acryl resin or the like. For example, a getter agent adsorbing the moisture, carbon dioxide ($CO_2$) or the like, may be added to the seal material 18B.

The substrate for sealing 19 along with the filler layer 18A and the seal material 18B, seal the white organic EL device 10W. The substrate for sealing 19 is configured of the material such as transparent glass with respect to each color light which exits from the red pixel 2R, the green pixel 2G, and the blue pixel 2B. On the face of the substrate 11 side in the substrate for sealing 19, for example, the color filter 19A which is made up of a red filter, a green filter, and a blue filter, is arranged respectively in the position corresponding to each pixel 2, and the BM layer 19B (light-shielding film) is arranged between the respective pixels 2. Hereby, white light which is emitted from each white organic EL device 10W within the red pixel 2R, the green pixel 2G, and the blue pixel 2B, transmits the color filter of each color, and thereby, red light, green light, and blue light respectively exit. Moreover, the substrate for sealing 19 absorbs the light which is reflected in the red pixel 2R, the green pixel 2G, the blue pixel 2B, and the wiring therebetween, and improves a contrast.

Method for Manufacturing Organic EL Display Device 1

For example, the organic EL display device 1 may be manufactured as follows.

First, on the substrate 11 which is made up of the material described above, the pixel drive circuit 12A (140) and the peripheral circuit 12B are formed. Along therewith, after forming the film by a sputter method, the metal layer 13A which is made up of the material described above, is formed by patterning the metal layer 13A into a desired shape, for example, by a photolithography method and etching. Thereafter, the inorganic insulating layer 14 which is made up of the material described above, is formed, for example, using a plasma chemical vapor deposition (CVD) method, on the pixel drive circuit 12A, the peripheral circuit 12B, and the metal layer 13A. However, at this time, the film formation method is not limited to the CVD method, and for example, a physical vapor deposition (PVD) method, an atomic layer deposition (ALD) method, a (vacuum) evaporation method or the like may be used. Next, the metal layer 13A is patterned so as to be exposed at the same time as the patterning by the photolithography method within the display region 110A, and the inorganic insulating layer 14 on the metal layer 13A is removed by the etching.

Subsequently, on the inorganic insulating layer 14, for example, the organic insulating layer 151 which is made up of the material described above, is formed by a coating method (wet method) such as a spin coat method or a droplet ejection method. Thereafter, the separation groove 21 is formed between the display region 110A and the peripheral region 110B, for example, by the photolithography method, and separates the organic insulating layer 151 from the display region 110A side and the peripheral region 110B side. Next, on the organic insulating layer 151, after forming the film by the sputter method, the lower electrode 161A which is made up of the material described above, and the metal film forming the conductive layer 161B, are formed by patterning the lower electrode 161A and the metal film into the desired shape, for example, by the photolithography method. Specifically, as shown in FIG. 1, the lower electrode 161 is cut in the vicinity of a boundary between the display region 110A and the peripheral region 110B, and the electrically non-conductive state is formed between both regions. Hereby, a side face and a bottom portion of the separation groove 21, and the end face of the organic insulating layer 151 of the peripheral region 110B side, are covered respectively by the lower electrode 161A and the conductive layer 161B corresponding thereto. Moreover, the end face of the outer edge side the organic insulating layer 151 of the peripheral region 110B side which is separated by the separation groove 21, is covered by the conductive layer 161B.

Next, on the lower electrode 161A, the conductive layer 161B, and the organic insulating layer 151, for example, the organic insulating layer 152 which is made up of the material described above, is formed by the coating method (wet method) such as the spin coat method or the droplet ejection method. Thereafter, the organic insulating layer 152 of the partial region of the peripheral region 110B, is removed for example, by the photolithography method. Subsequently, on the organic insulating layer 152, each layer of the organic layer 160 which is made up of the material described above, is formed for example, by the evaporation method, using an area mask covering the display region 110A. At this time, actually, from the display region 110A to the taper region A1 shown in FIG. 1, the organic layer 160 is formed to wrap around.

Next, the upper electrode 162 which is made up of the material described above, is formed on the organic layer 160 and the conductive layer 161B, for example, using the sputter method. Subsequently, on the upper electrode 162, the protective layer 17 which is made up the material described above is formed, for example, using the plasma CVD method, the PVD method, the ALD method, the evaporation method or the like.

Next, on the substrate for sealing 19 which is made up of the material described above, for example, after the coating by the sputter method, the color filter 19A and the BM layer 19B are respectively formed by taper turning using the photolithography method. Subsequently, on the substrate for sealing 19, the filler layer 18A and the seal material 18B which are made up of the materials described above, are respectively formed. Finally, the filler layer 18A and the seal material 18B are put therebetween, and the substrate for sealing 19 is bonded. As described above, the organic EL display device 1 shown in FIG. 1, is completed.

Operations and Effects of Organic EL Display Device 1

In the organic EL display device 1, the scan signal is supplied from the scan line drive circuit 130 to each pixel 2, through the gate electrode of the write-in transistor Tr2, and the image signal is stored in the storage capacitor Cs, through the write-in transistor Tr2 from the signal line drive circuit 120. That is, ON and OFF of the drive transistor Tr1 is controlled depending on the signal which is stored in the storage capacitor Cs. Hereby, a drive current Id is injected into the white organic EL device 10W, and the emitting of the light occurs by recombining the positive hole and the electron. Here, since the organic EL display device 1 is the upper face light-emitting type (top emission type), the light is taken out by transmitting the upper electrode 162, the protective layer 17, the filler layer 18A, the color filter (not shown) of each color, and the substrate for sealing 19. In this manner, the video display (color video display) is made in the organic EL display device 1.

Incidentally, the organic EL display device generally has problems that time-dependent stability is low and a lifespan is short, such that deterioration of the organic layer due to moisture absorption is generated in the organic EL device, the light-emitting luminance is lowered, or the emitting of the light is unstable in the organic EL device.

COMPARATIVE EXAMPLE

Figure 6:
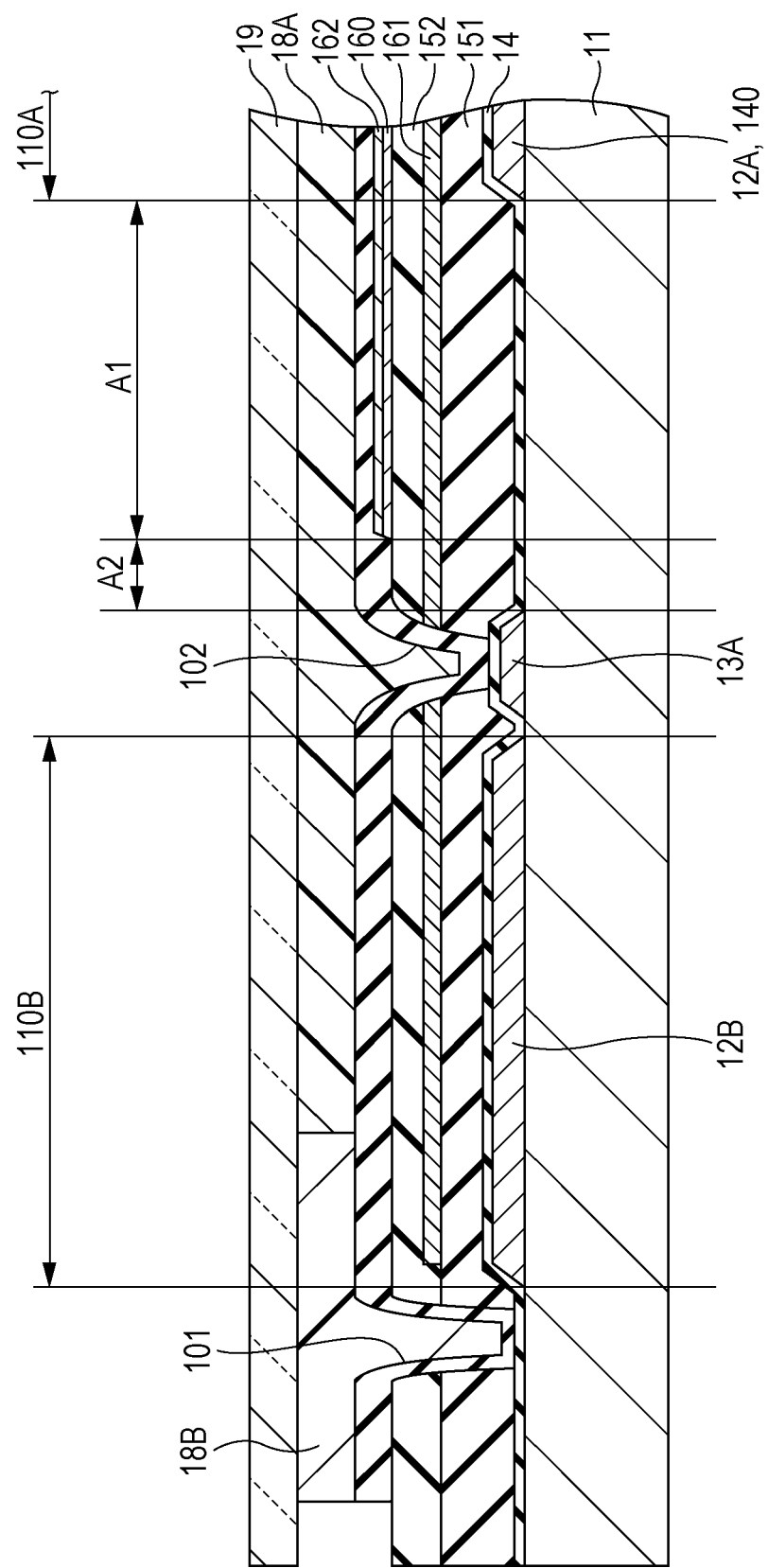
FIG. 6 is a cross-sectional view illustrating a configuration of an organic EL display device according to Comparative Example.

In an organic EL display device (organic EL display device 100) according to Comparative Example shown in FIG. 6, by arranging a structure of preventing the infiltration of the moisture to the organic layer 160 as follows, the above problems (deterioration of the organic layer in the organic EL device which is caused by the moisture) are solved. FIG. 6 is a diagram illustrating a cross-sectional configuration of the organic EL display device 100 according to Comparative Example. In the organic EL display device 100, as a structure of preventing the infiltration of the moisture to the organic layer 160, two (two types) separation grooves 101 and 102 are formed in the position (outer edge side and outer periphery side of the display region 110A) surrounding the display region 110A.

Specifically, first, in the region (vicinity of the end portion of the substrate 11) corresponding to the seal material 18B, the separation groove 101 which separates the organic insulating layers 151 and 152 respectively from the inner region thereof and the outer region thereof, is formed. Moreover, a separation groove 102 is formed in the region between the display region 110A and the peripheral region 110B, specifically, in the region between the outer peripheral side (outer edge side) of the taper region A1 described before and a mask shift region A2, and the peripheral region 110B. The separation groove 102 is different from the separation groove 21 in the organic EL display device 1 according to the embodiment, and separates both of the organic insulating layers 151 and 152 from the display region 110A side and the peripheral region 110B side.

In the organic EL display device 100 according to Comparative Example, by arranging the separation groove 102, the moisture which is present in the organic insulating layers 151 and 152 of the peripheral region 110B side, is avoided from infiltrating the display region 110A side by passing through the organic insulating layers 151 and 152. Consequently, it is possible to prevent the infiltration of the moisture to the organic layer 160 from the outside by the separation groove 102, and in addition thereto, it is possible to suppress the deterioration of the organic layer 160 which is caused by the moisture left behind within the organic EL display device 100 passing through the organic insulating layers 151 and 152.

However, as described before, when the area mask is used at the time of forming the organic layer 160 configuring the white organic EL device 10W, the following problems are generated in the organic EL display device 100 of Comparative Example. That is, in this case, in consideration of an alignment shift (mask shift region A2 of the drawing) of the area mask and wraparound (taper region A1 of the drawing) of the film, the separation groove 102 is necessary to be formed in the position which is sufficiently distant from the display region 110A. Specifically, as described above, the separation groove 102 is formed in the region between the outer periphery side (outer edge side) of the taper region A1 and the mask shift region A2, and the peripheral region 110B. The reason is as follows. Since the separation groove 102 is a groove for separating both of the organic insulating layers 151 and 152, it is not possible to form the separation groove 102 in the taper region A1 where the organic layer 160 is formed (may be formed), and the mask shift region A2.

From this, in the organic EL display device 100 of Comparative Example, a necessity to widen a frame is generated as shown in FIG. 6, and it is difficult to achieve frame narrowing. In addition, since the necessity to widen the distance between the display region 110A and the peripheral region 110B is generated, the moisture which is included within the organic insulating layers 151 and 152 infiltrates the organic layer 160 in the region (inner region of the separation groove 102), and thereby, the organic layer 160 deteriorates.

Embodiment

In contrast thereto, in the organic EL display device 1 of the embodiment, differently from Comparative Example, the separation groove 21 which separates the organic insulating layer 151 from the display region 110A side and the peripheral region 110B side, is arranged between the display region 110A and the peripheral region 110B. Moreover, the outer periphery (outer edge) of the organic insulating layer 152 is removed than the assumed taper region A1, and the end face of the organic insulating layer 152 is covered (covering portion 22) by the organic layer 160 or the upper electrode 162. Furthermore, the organic layer 160 (and the organic insulating layer 152) is sealed (sealing portion 23) by the conductive layer 161A, and the upper electrode 162 which is formed in the upper layer than the organic layer 160. That is, in the organic EL display device 1, differently from Comparative Example, the organic insulating layer 151 of the lower layer side is selectively separated on an inner periphery side than the taper region A1 and the mask shift region A2. Moreover, the organic insulating layer 152 which is arranged in the peripheral region 110B, is removed from the display region 110A more than a formation region of the organic layer 160, and the organic layer 160 along with the organic insulating layer 152 are sealed by the conductive layer 161B and the upper electrode 162. Furthermore, the end face of the outer edge side of the organic insulating layer 151 which is separated from the peripheral region 110B side by the separation groove 21, is covered (covering portion 24) by the conductive layer 161B.

Hereby, in the embodiment, differently from Comparative Example in which the separation groove 102 is formed, the infiltration of the moisture that is included within the organic insulating layer 151 which is formed in the peripheral region 110B to the organic layer 160, is avoided. Additionally, an amount of the moisture which has the concern of infiltrating the organic layer 160 from the organic insulating layer 152, is reduced. Still more, the infiltration of the moisture to the organic insulating layer 151 of the peripheral region 110B side from the outside, or the infiltration of gas which has the concern of deteriorating the organic layer 160, is prevented, and the infiltration of the moisture to the organic layer 160, the organic insulating layer 152 or the organic insulating layer 151 of the display region 110A side, is further reduced.

Moreover, since the structure (separation groove 21) of preventing the infiltration of the moisture to the organic layer 160, can be formed between the display region 110A and the peripheral region 110B (inner region of the taper region A1 and the mask shift region A2 in Comparative Example), it is possible to form the peripheral circuit 12B (peripheral region 110B) on the display region 110A side, in comparison with Comparative Example. That is, it is possible to narrow (shorten the distance between the display region 110A and the peripheral region 110B) the frame in comparison with Comparative Example, and the frame narrowing (size reduction of the display device, and cost reduction) is realized.

Additionally, in the separation groove 21 according to the embodiment, by stacking the conductive layer 161B where the upper electrode 162 is stacked, and the metal layer 13A, the upper electrode 162 and the metal layer 13A are electrically connected. That is, between the display region 110A and the peripheral region 110B, since the cathode contact 21A is arranged so as to continually surround the display region 110A, it is possible to reduce luminance unevenness within the display panel.

In the embodiment described above, between the display region 110A and the peripheral region 110B, the separation groove 21 which separates the organic insulating layer 151 from the display region 110A side and the peripheral region 110B side, is formed. Moreover, since the covering portion 22 where the end face of the organic insulating layer 152 is covered by the organic layer 160 or the upper electrode 162, and the sealing portion 23 where the organic layer 160 is sealed by the conductive layer 161B and the upper electrode 162, are arranged, it is possible to avoid the infiltration of the moisture to the organic layer 160. Still more, since the covering portion 24 where the end face of the outer edge side of the organic insulating layer 151 which is separated from the peripheral region 110B side by the separation groove 21 is covered by the conductive layer 161B, is arranged, the infiltration of the moisture to the organic insulating layer 151 of the peripheral region 110B side from the outside, or the infiltration of the gas which has the concern of deteriorating the organic layer 160, can prevented. Accordingly, it is possible to improve reliability by suppressing the deterioration of the organic EL device 10, and it is possible to shorten the distance between the display region 110A and the peripheral region 110B, and it is possible to achieve the frame narrowing.

2. MODIFICATION EXAMPLE

Subsequently, Modification Examples (Modification Examples 1 to 3) of the embodiment will be described. Furthermore, the same reference signs are attached to the same components in the embodiment, and the description will be appropriately omitted.

MODIFICATION EXAMPLE 1

Figure 7:
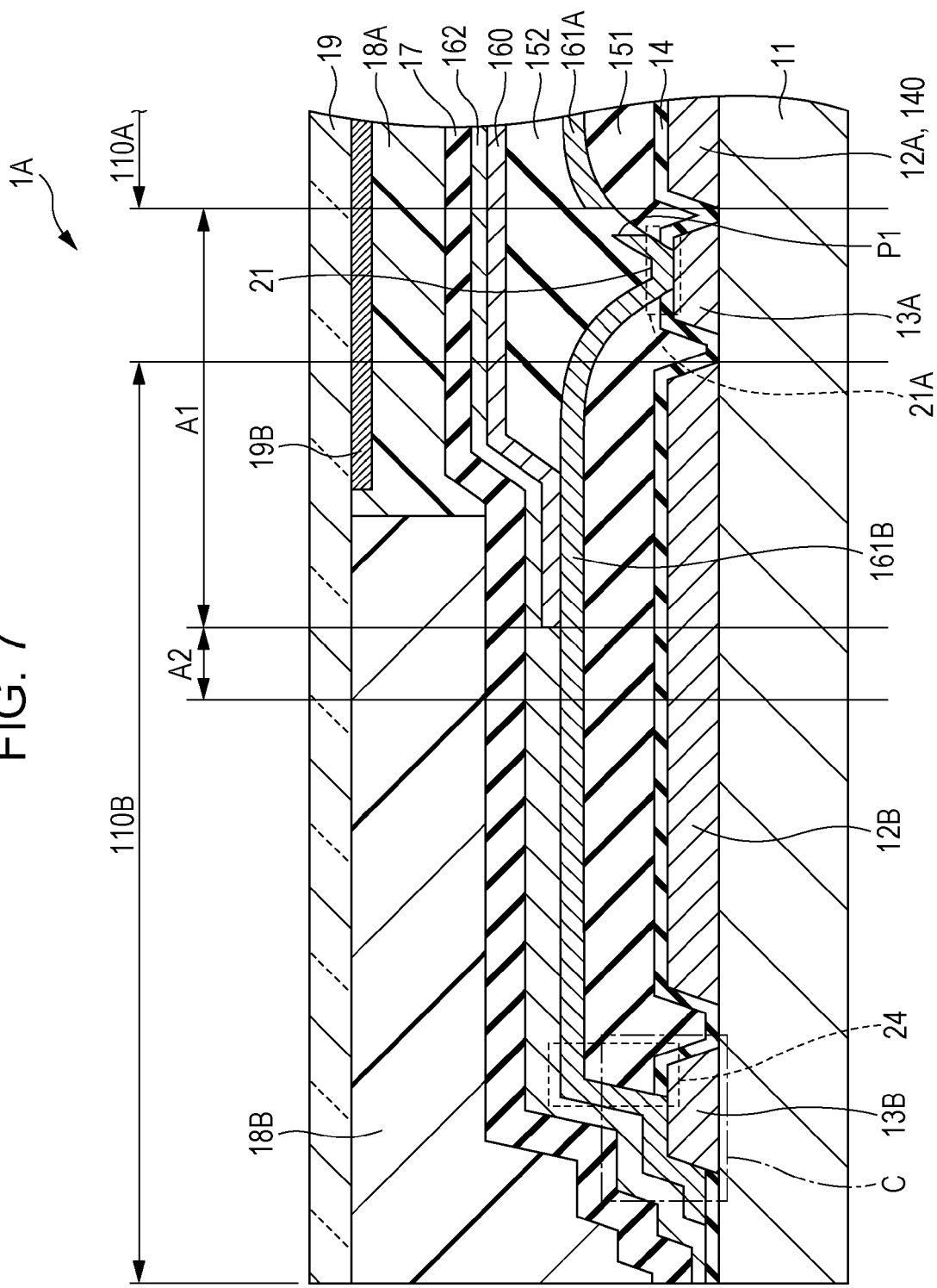
FIG. 7 is a cross-sectional view illustrating a configuration of an organic EL display device according to Modification Example 1.
Figure 8:
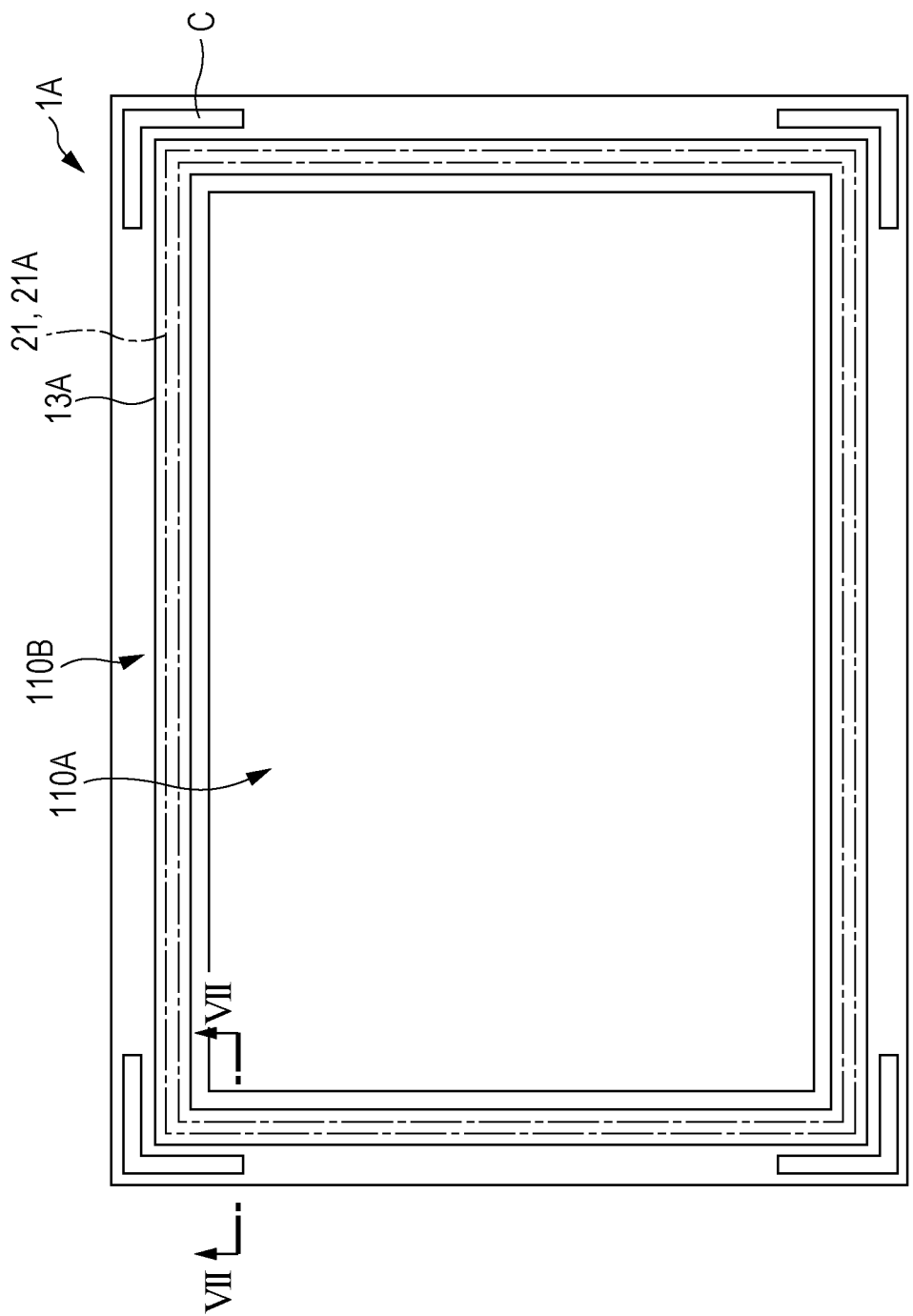
FIG. 8 is a plan view of the organic EL display device shown in FIG. 7.

FIG. 7 is a diagram illustrating a cross-sectional configuration of an organic EL display device (organic EL display device 1A) according to Modification Example 1 of the embodiment. In the organic EL display device 1A, a point that the metal layer 13B is arranged on the outside of the peripheral circuit 12B, and the conductive layer 161B and the upper electrode 162 are electrically connected in the metal layer 13B, is different from the embodiment. FIG. 8 is a diagram illustrating a planar configuration of the organic EL display device 1A shown in FIG. 7, and FIG. 7 is a cross-sectional view of the organic EL display device 1A along a VII-VII line shown in FIG. 8.

The same effects as the embodiment, can be obtained in the organic EL display device 1A having such the configuration. Moreover, the metal layer 13B is arranged on the outside of the peripheral circuit 12B, and thereby, it is possible to lower the resistance more than the cathode contact of only the conductive layer 161B and the metal layer 13A, and it is possible to further reduce the luminance unevenness of the display panel. The stacked structure of the upper electrode 162 through the metal layer 13B and the conductive layer 161B, may be arranged continually in the vicinity of the display region 110A as the cathode contact 21A shown in FIG. 2, or for example, as shown in FIG. 8, may be arranged respectively at four corners of the peripheral region 110B, in a state of being separated.

Modification Example 2

Figure 9:
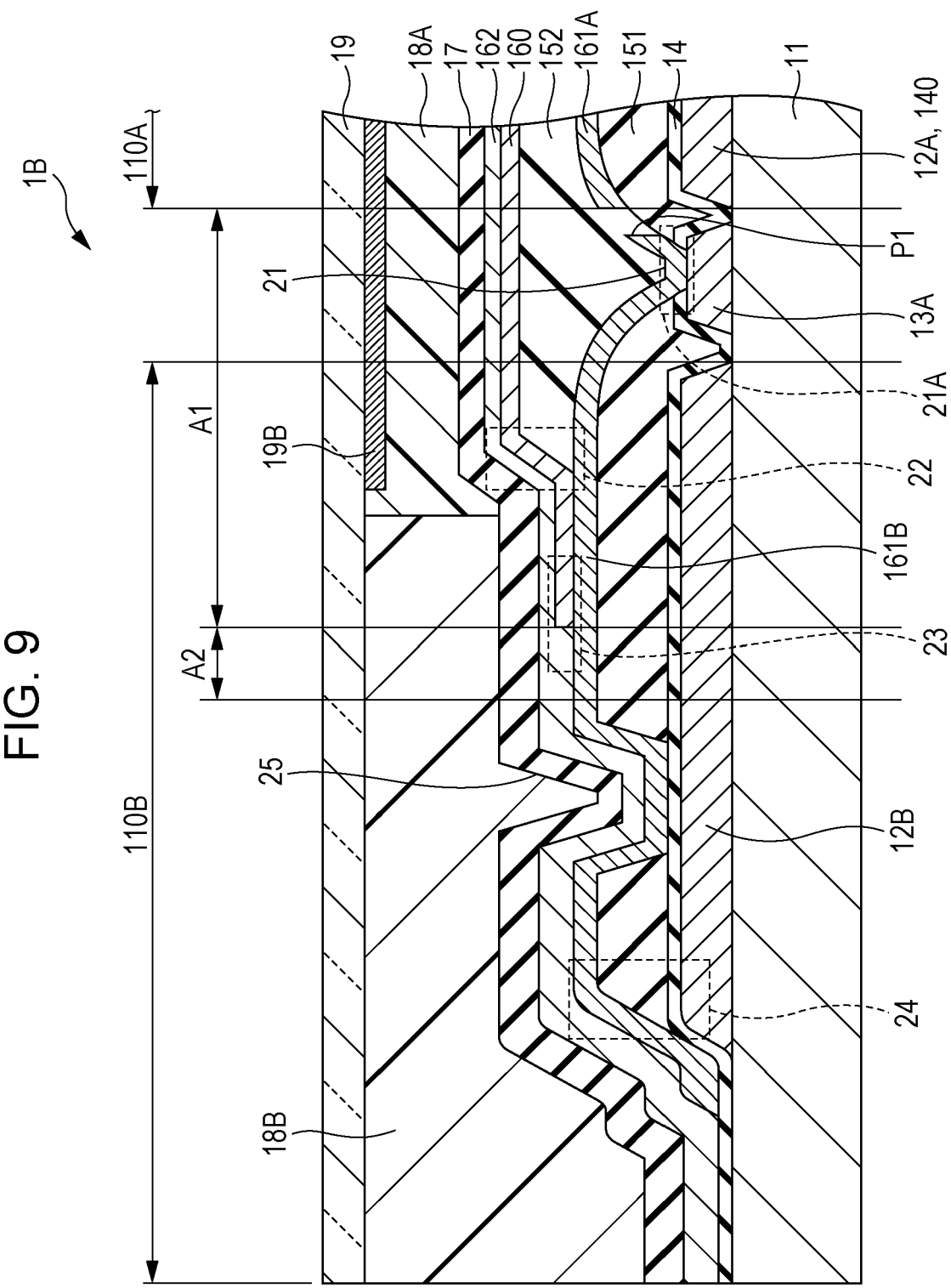
FIG. 9 is a cross-section view illustrating an example of a configuration of an organic EL display device according to Modification Example 2.
Figure 10:
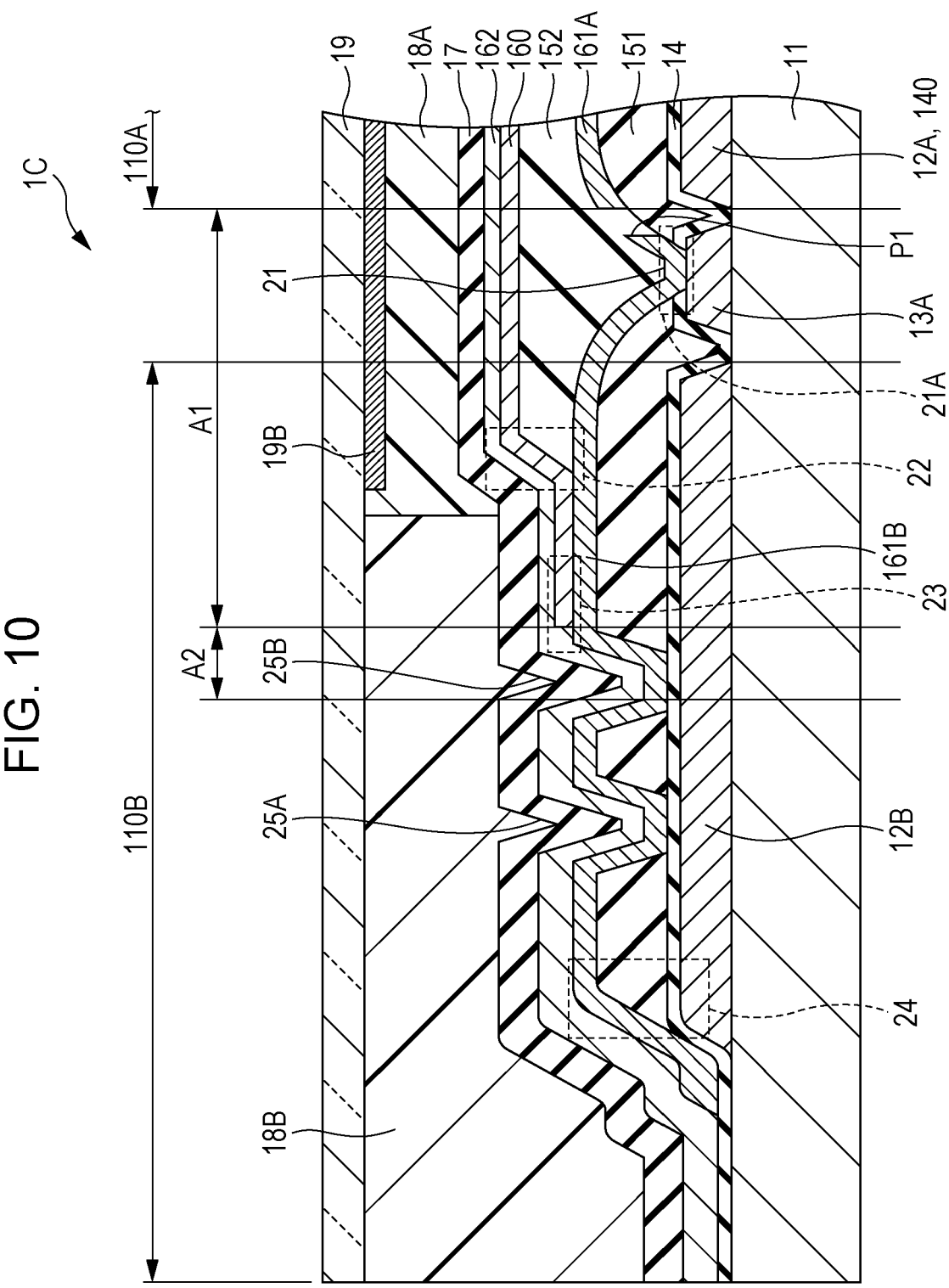
FIG. 10 is a cross-sectional view illustrating another example of the configuration of the organic EL display device according to Modification Example 2.
Figure 11:
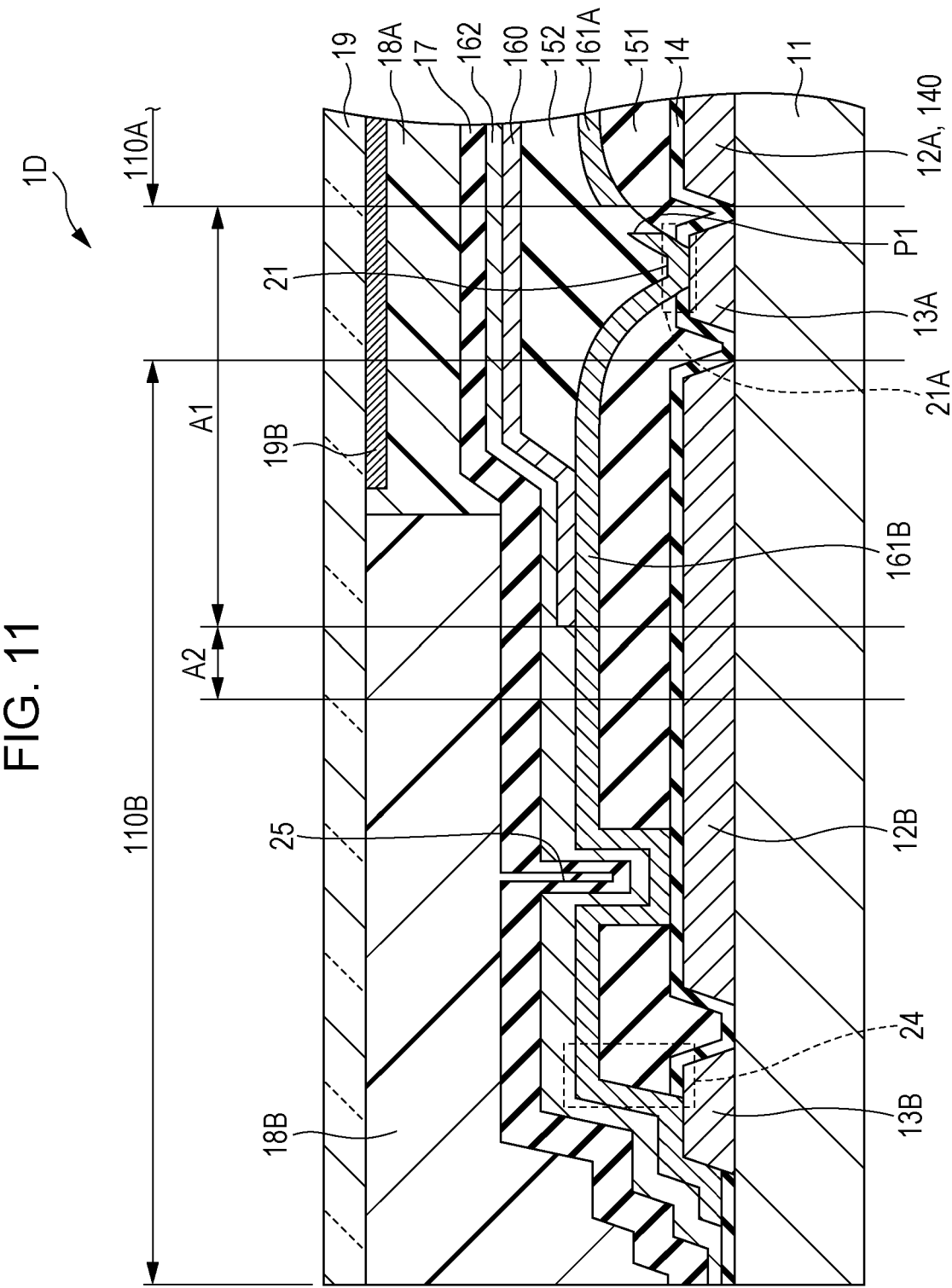
FIG. 11 is a cross-sectional view illustrating another example of the configuration of the organic EL display device according to Modification Example 2.
Figure 12:
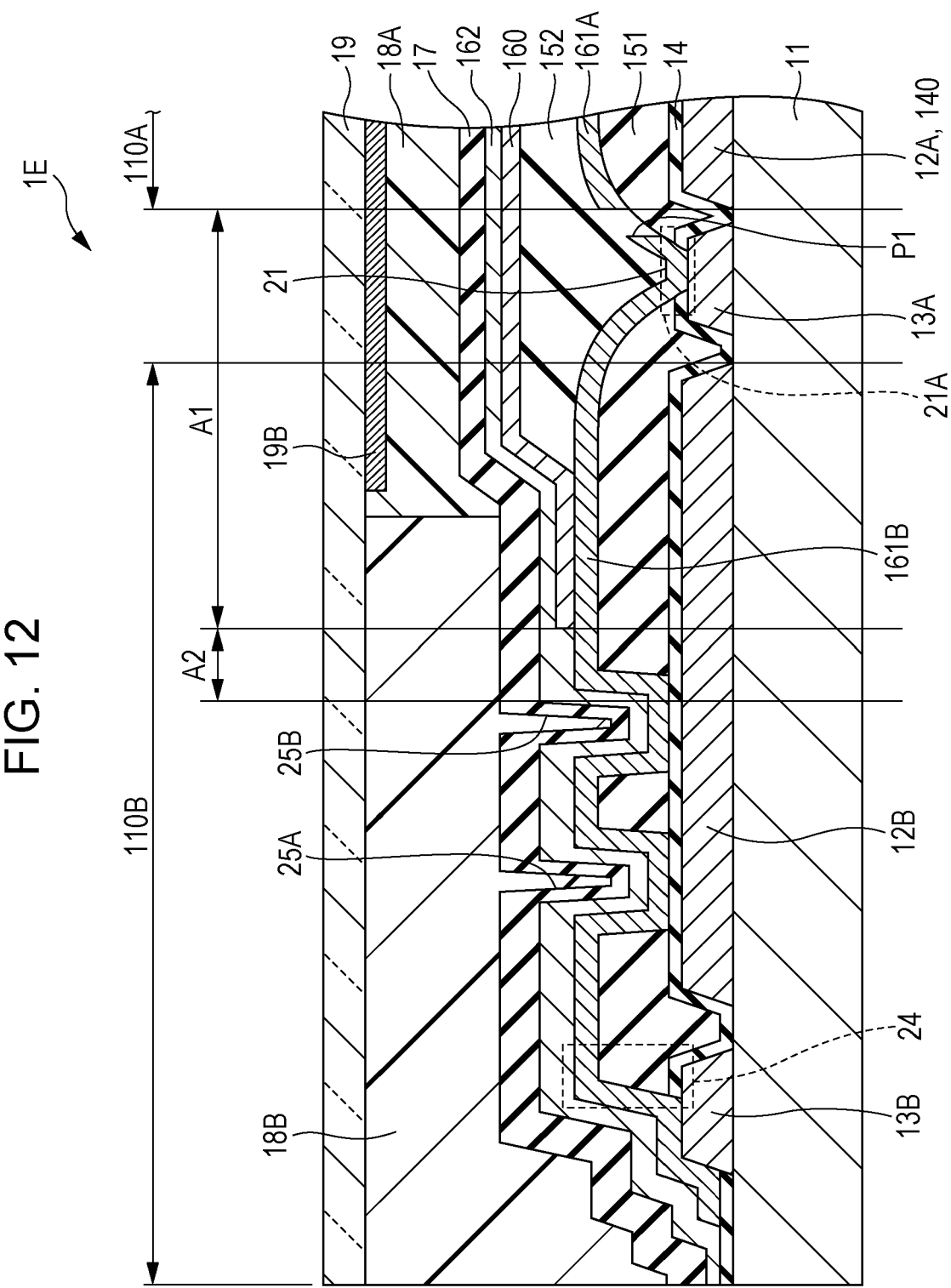
FIG. 12 is a cross-sectional view illustrating another example of the configuration of the organic EL display device according to Modification Example 2.

FIG. 9 and FIG. 10 are diagrams illustrating cross-sectional configurations of organic EL display devices (organic EL display devices 1B and 1C) according to Modification Example 2. In the organic EL display devices 1B and 1C, the point that one (organic EL display device 1B) separation groove is formed, or a plurality (organic EL display device 1C) of separation grooves (separation grooves 25 (25A and 25B)) are formed in the organic insulating layer 151 of the outside more than the separation groove 21, is different from the embodiment. Additionally, FIG. 11 and FIG. 12 are diagrams in a case of combining Modification Example 2 and Modification Example 1, that is, diagrams illustrating the cross-sectional configuration of the organic EL display device where the metal layer 13B is arranged on the outside of the peripheral circuit 12B, and the conductive layer 161B and the upper electrode 162 are electrically connected in the metal layer 13B, and one (organic EL display device 1D) separation groove is formed or the plurality (organic EL display device 1E) of separation grooves 25 (25A and 25B) are formed in the organic insulating layer 151 between the separation groove 21, and an electrical connection portion C of the metal layer 13B and the upper electrode 162. In Modification Example 2, an example of arranging the separation groove which separates the organic insulating layer 151, by one (separation groove 25) or two (separation grooves 25A and 25B) is shown, but is not limited thereto, and may be formed by three of more.

The same effects as the embodiment can be obtained in the organic EL display devices 1B to 1E having such the configurations. Moreover, by arranging the separation groove 25 of one or the separation grooves 25 (25A and 25B) of two or more, in the organic insulating layer 151 of the outside more than the separation groove 21, the effect of further reducing the moisture which is included within the organic insulating layer 151, and the infiltration of the moisture from the outside in the case of the organic insulating layer 151 as an infiltration path, is obtained.

Modification Example 3

Figure 13:
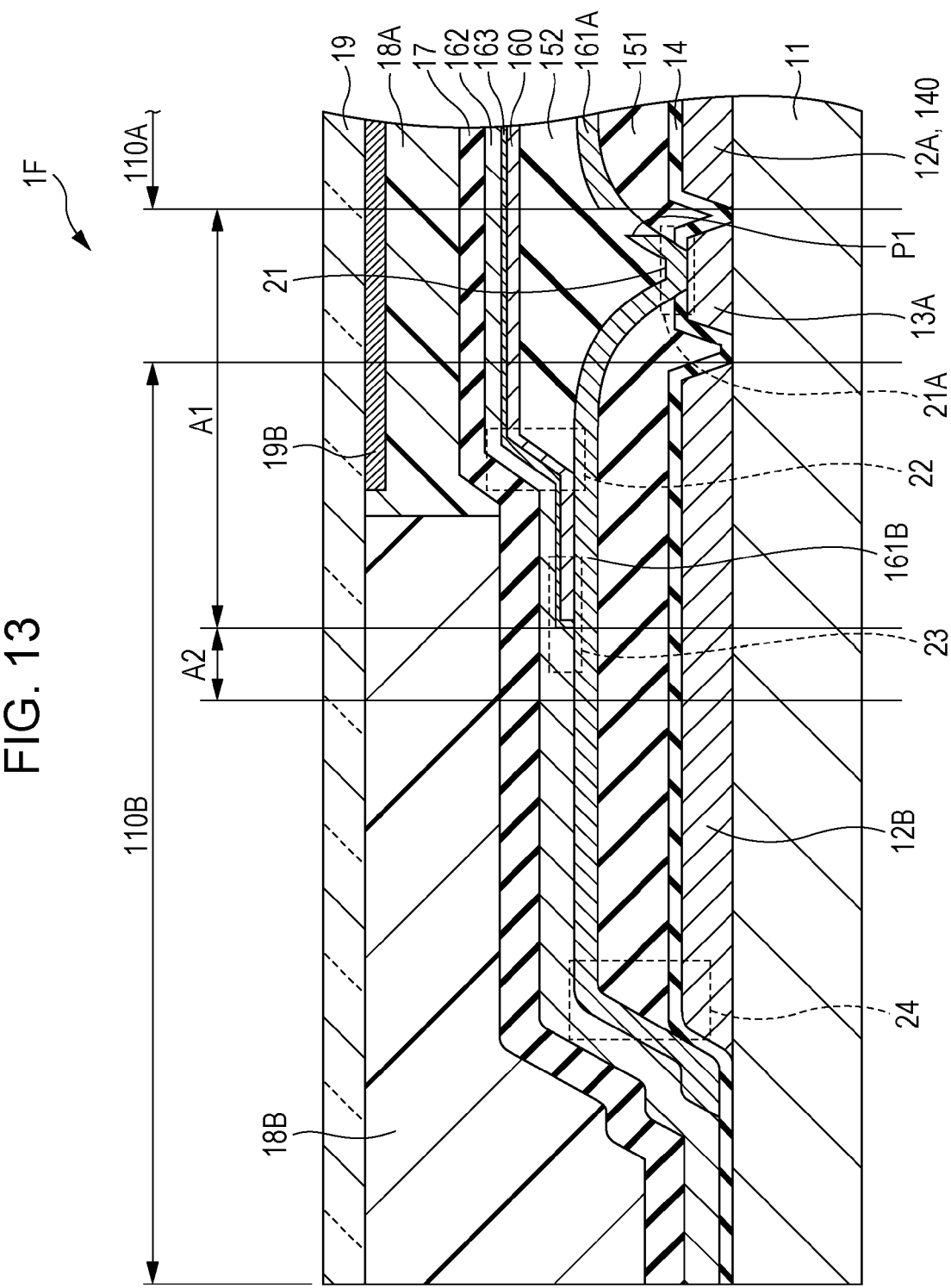
FIG. 13 is a cross-sectional view illustrating an example of a configuration of an organic EL display device according to Modification Example 3.
Figure 14:
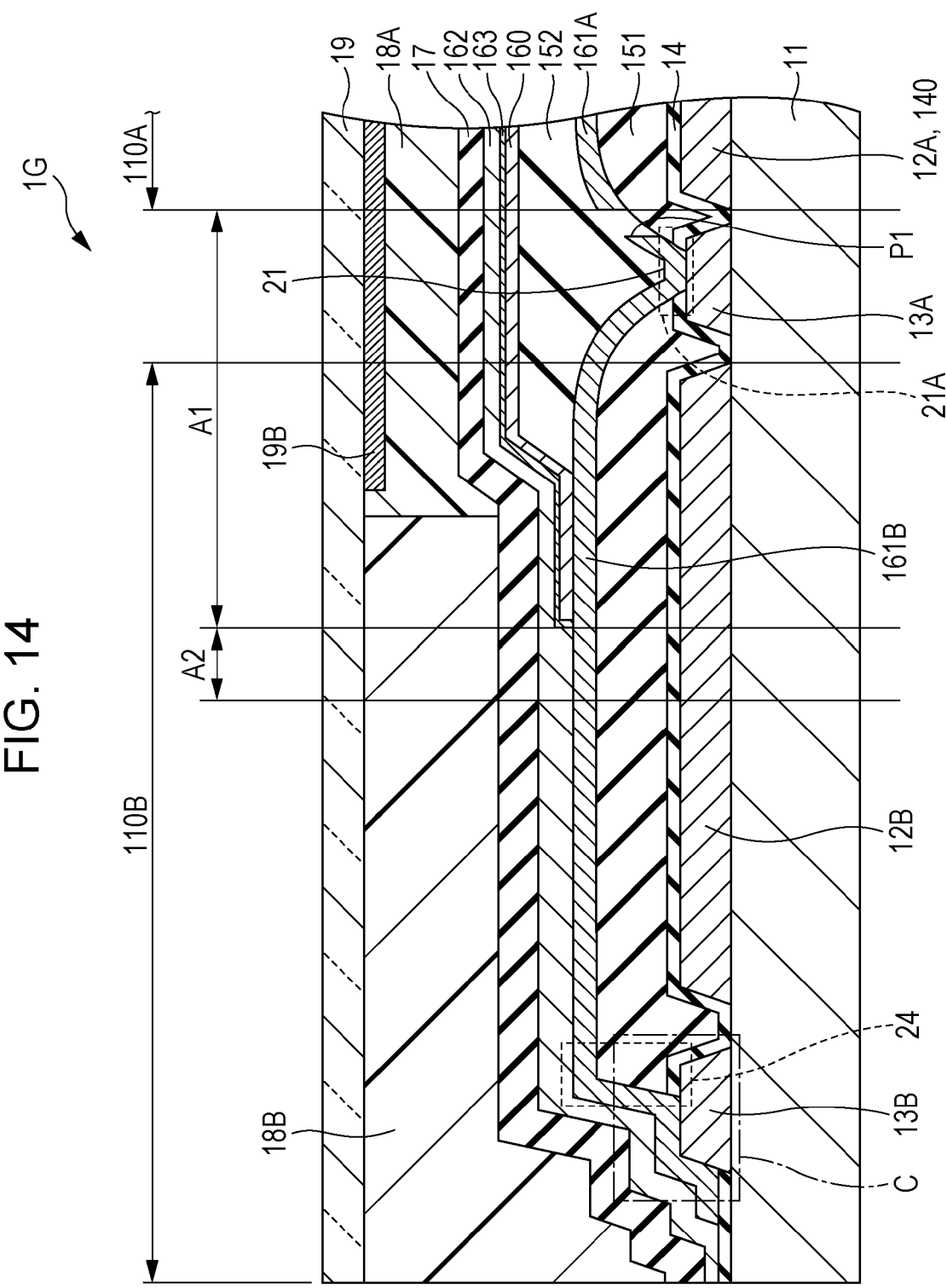
FIG. 14 is a cross-sectional view illustrating another example of the configuration of the organic EL display device according to Modification Example 3.

FIG. 13 is a diagram illustrating a cross-sectional configuration of an organic EL display (organic EL display device 1F) according to Modification Example 3. FIG. 14 is a diagram of an organic EL display device (organic EL display device 1G) in the case of combining Modification Example 3 and Modification Example 1. In the organic EL display device 1F and the organic EL display device 1G, the point that a high resistance layer 163 is arranged between the organic layer 160 and the upper electrode 162, is different from the embodiment and Modification Example 1.

As shown in FIG. 13 and FIG. 14, for example, the high resistance layer 163 is arranged by being extended from the formation region the organic layer 160 so as to cover the upper face and the side face (end face) of the organic layer 160, and the end face thereof is sealed by the conductive layer 161B and the upper electrode 162, in the same manner as the organic layer 160 in the embodiment. As a material of the high resistance layer 163, for example, the material of which resistivity is 1 Ωcm to $10^7$ Ωcm, specifically, niobium oxide ($NbO_x$), titanium oxide ($TiO_x$), molybdenum oxide ($MoO_x$), tantalum oxide ($TaO_x$), a mixture of niobium oxide ($NbO_x$) and titanium oxide ($TiO_x$), a mixture of titanium oxide ($TiO_x$) and zinc oxide ($ZnO_x$), or a mixture of silicon oxide ($SiO_x$) and tin oxide ($SnO_x$) may be used.

In this manner, by arranging the high resistance layer 163 between the organic layer 160 and the upper electrode 162, the effect of suppressing a blinking point is achieved in the organic EL display devices 1F and 1G, in addition to the effects of the embodiment.

3. APPLICATION EXAMPLE

Hereinafter, Application Examples of the organic EL display devices (organic EL display devices 1, and 1A to 1G) which are described in the embodiment and Modification Examples 1 to 3, will be described. The organic EL display device of the embodiment, can be applied to a display device of electronic apparatuses of all fields that displays a video signal which is input from the outside, or the video signal which is internally generated, as an image or video, such as a television device, a digital camera, a notebook type personal computers, a portable terminal device such as a cellular phone, or a video camera. In particular, the organic EL display device of the embodiment is suitable for a small and medium sized display for mobile. Hereinafter, an example thereof is shown.

APPLICATION EXAMPLE 1

Figure 15A:
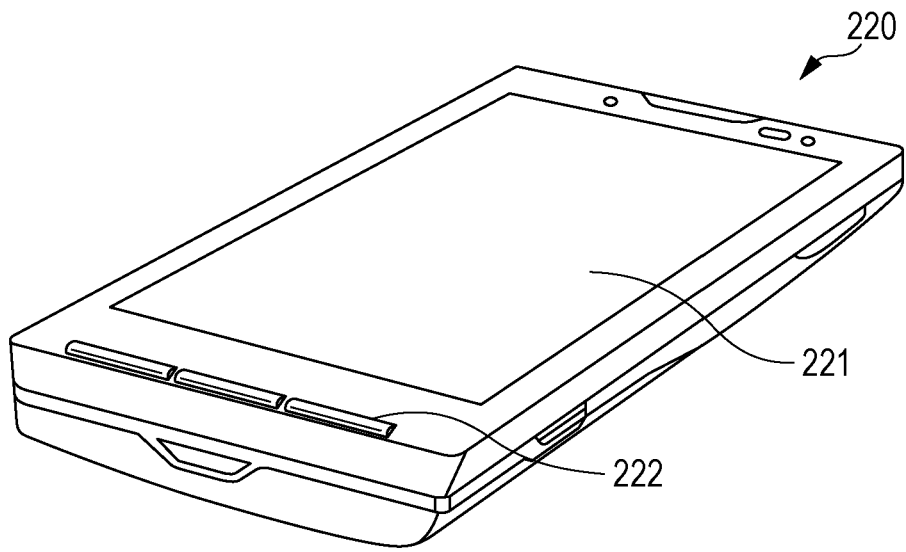
FIG. 15A is a perspective view illustrating an appearance when seen from a front side of Application Example 1 of a display device using a pixel of the embodiment.
Figure 15B:
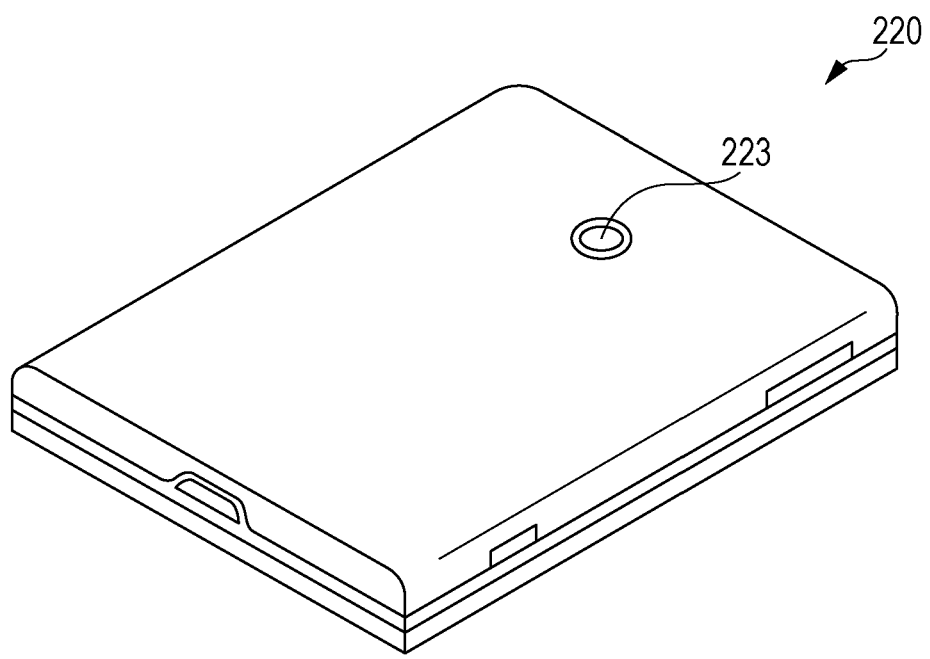
FIG. 15B is a perspective view illustrating the appearance when seen from a back side of Application Example 1 of the display device using the pixel of the embodiment.

FIG. 15A and FIG. 15B are diagrams illustrating an appearance of a smart phone 220 according to Application Example 1. For example, the smart phone 220 has a display portion 221, and an operation portion 222 on a front side thereof, and has a camera 223 on a rear side thereof. The organic EL display device of the embodiment or the like, is mounted on the display portion 221.

APPLICATION EXAMPLE 2

Figure 16:
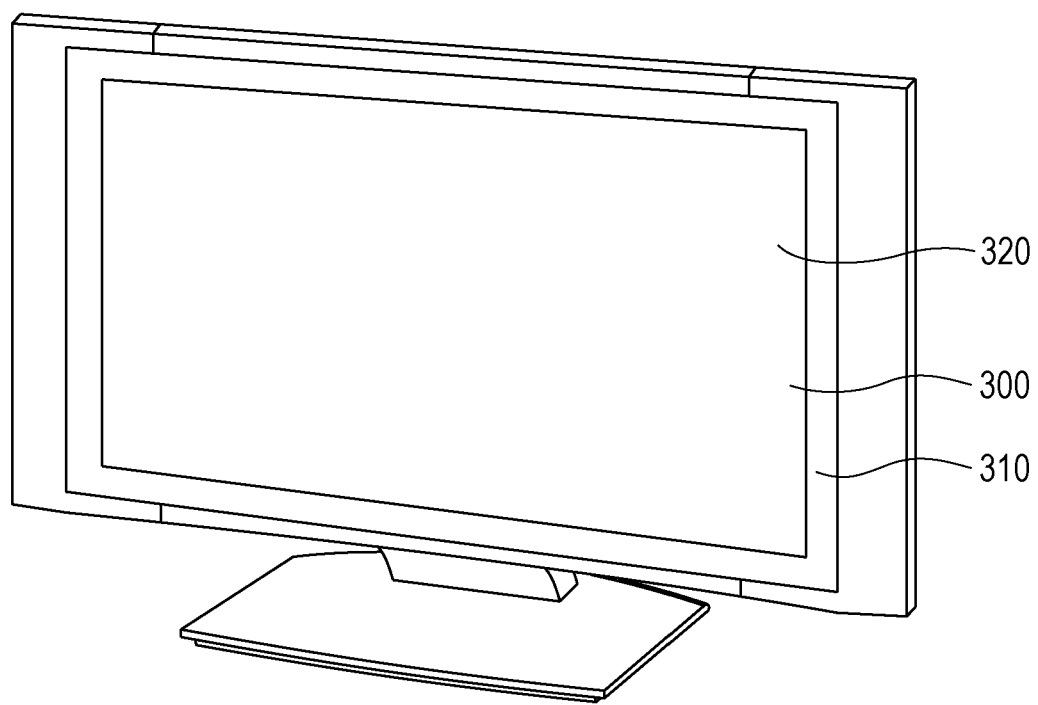
FIG. 16 is a perspective view illustrating an appearance of Application Example 2.

FIG. 16 is a diagram illustrating an appearance of a television device according to Application Example 2. For example, the television device has a video display screen portion 300 including a front panel 310 and a filter glass 320. The video display screen portion 300 corresponds to the organic EL display device of the embodiment or the like.

APPLICATION EXAMPLE 3

Figure 17A:
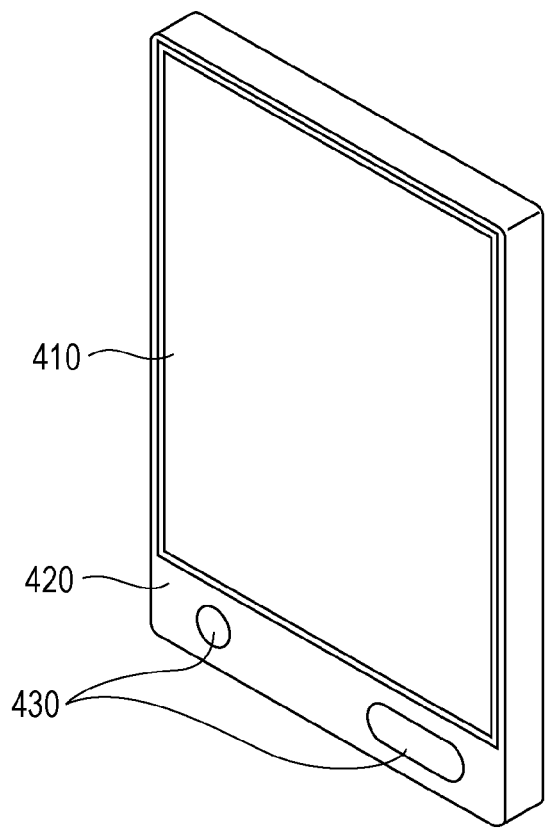
FIG. 17A is a perspective view illustrating an example of an appearance of Application Example 3.
Figure 17B:
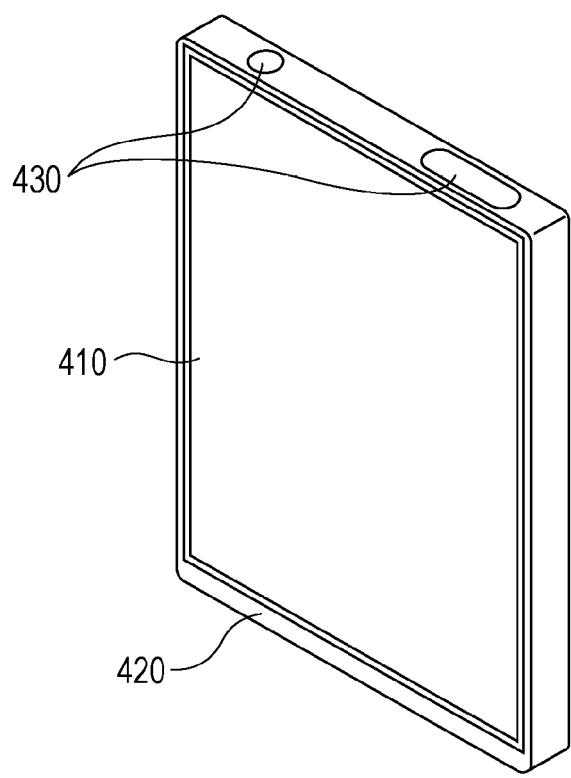
FIG. 17B is a perspective view illustrating another example of the appearance of Application Example 3.

FIG. 17A and FIG. 17B are diagrams illustrating an appearance of a tablet personal computer 440 according to Application Example 3. For example, the tablet personal computer 440 has a case 420 in which a touch panel portion 410 and an operation portion 430 are placed. The organic EL display device of the embodiment or the like, is mounted on the touch panel portion 410.

OTHER MODIFICATION EXAMPLES

As described above, the present disclosure is described using the embodiment, Modification Examples 1 to 3, and Application Examples, but the present disclosure is not limited to the embodiment or the like, and can be variously modified.

For example, the material, the thickness, the film formation method and the film formation condition of each layer which is described in the embodiment or the like, are not limited, and other materials and other thickness may be used, or other film formation methods and other film formation conditions may be used. Specifically, for example, in the embodiment or the like, the case that "the first insulating layer and the second insulating layer" are respectively the organic insulating layers (organic insulating layers 151 and 152), is described in the present disclosure, but in some cases, the insulating layer may be configured of other materials, other than the organic material.

Moreover, in the embodiment or the like, the case that the organic EL display device is the upper face light-emitting type (top emission type), is described, but it is not limited thereto, and for example, may be configured to be a lower face light-emitting type (bottom emission type). In the case of the lower face light-emitting type organic EL display device, for example, the lower electrode 161 is formed using any one of ITO, IZO and ZnO, and the upper electrode 162 is formed using Al, MgAg, or the stacked structure of ITO, Ag and ITO, and a stacked order of the organic layer 160 is formed reversely to the embodiment. In this case, the color filter 19A is arranged between the layer where TFT (Tr1) is formed, and the organic insulating layer 151. In the organic EL display device of a combustible light-emitting type, the light from the light-emitting layer within the organic layer 160, is taken out to the outside by transmitting the lower electrode and the substrate 11. Moreover, in the organic EL display device, a so-called microcavity (microresonator) structure may be arranged. For example, the microresonator structure is a structure that the plurality of layers having a predetermined refractive index difference are stacked between a pair of reflective films, and optical confinement is performed by repeatedly reflecting the incident light between the pair of reflective films.

Furthermore, in the embodiment or the like, the configuration of the organic EL device is described using a specific example, but all layers is not necessarily included, and other layers may be included. For example, in the embodiment or the like, the configuration of the organic layer 160 of the organic EL device (white organic EL device 10W), is the stacked structure of stacking the positive hole injection layer 160A, the positive hole transport layer 160B, the light-emitting layer 160C, the electron transport layer 160D, and the electron injection layer 160E in order from the lower electrode 161 side, but is not limited thereto. For example, a so-called stack structure, specifically, may be a configuration of forming a charge generation layer on the stacked structure, and stacking a positive hole injection layer 160A', a positive hole transport layer 160B', a light-emitting layer 160C', an electron transport layer 160D', and an electron injection layer 160E' on the charge generation layer. Moreover, the charge generation layer is put therebetween, and the respective layers (for example, the position hole injection layers 160A and 160A') may be formed by the same materials to each other, or may be formed using different materials. It is preferable that the material which is suitable for the respective light-emitting layers 160C and 160C' is used. Still more, the respective light-emitting layers 160C and 160C' are not necessarily the simple substances, and the light-emitting layer which emits the light of the different color may be stacked into two or more layers. Specifically, for example, when the white organic EL device 10W is used as an organic EL device in the same manner as the embodiment, a blue light-emitting layer may be formed as a light-emitting layer 160C, and a yellow light-emitting layer may be formed as a light-emitting layer 160C'. Alternatively, the white EL device 10W may be used by stacking a blue light-emitting layer as a light-emitting layer 160C, a red light-emitting layer as a light-emitting layer 160C', and two layers of green light-emitting layers.

Furthermore, among the organic insulating layer 151 that is separated by the separation groove 21, there is no problem that the organic insulating layer 151 which is arranged on the peripheral region 110B side is removed.

Additionally, in the embodiment or the like, an active matrix type display device is described, but the present disclosure can be applied to a passive matrix type display device. Moreover, the configuration of the pixel drive circuit for an active matrix drive, is not limited to the description in the embodiment, and a capacitor device or a transistor may be added as necessary. In this case, depending on alteration of the pixel drive circuit, in addition to the signal line drive circuit 120 and the scan line drive circuit 130, a necessary drive circuit may be added.

Moreover, in the embodiment or the like, three types of the red pixel 2R, the green pixel 2G, and the blue pixel 2B are exemplified as a color pixel, but are not limited thereto, and for example, the color pixel such as a white pixel 2W or a yellow pixel 2Y, may be combined. The effects described herein are simply exemplified, and are limited thereto. Still more, other effects may be obtained.

Furthermore, the present disclosure may be configured as follows.

(1) An organic EL display device including a display region where a plurality of pixels having a light-emitting device which is stacked respectively in order of an organic layer including a first electrode and a light-emitting layer, and a second electrode from a substrate side, are arranged, a peripheral region that is arranged on an outer edge side of the display region, and has a peripheral circuit, a first insulating layer of a lower layer side and a second insulating layer of an upper layer side that are arranged so as to be extended to the peripheral region from the display region, a first separation groove that is arranged in the first insulating layer between the display region and the peripheral region, a first conductive layer that is arranged on the first insulating layer of the peripheral region, through a bottom portion from a side face of the first separation groove, a first covering portion where at least an end face of the second insulating layer is covered by the organic layer or the second electrode, a sealing portion that is arranged on an outer edge side of the first covering portion, and is configured by stacking the first conductive layer and the second electrode, and a second covering portion where an end face of an outer edge side of the first insulating layer which is separated from the peripheral region side by the first separation groove, is covered by the first conductive layer.

(2) The organic EL display device according to the above (1), in which a second conductive layer and a third insulating layer are arranged between the substrate and the first insulating layer in order thereof from the substrate side, the first separation groove separates the first insulating layer and the third insulating layer, and a connection portion where the first conductive layer and the second conductive layer are stacked in the bottom portion of the first separation groove, is formed.

(3) The organic EL display device according to the above (2), in which the second electrode and the second conductive layer are electrically connected through the first conductive layer.

(4) The organic EL display device according to any one of the above (1) to (3), in which the first electrode and the first conductive layer are formed by the same process.

(5) The organic EL display device according to any one of the above (1) to (4), further including a second separation groove that is arranged in the peripheral region, and separates the first insulating layer from an inner region side and an outer region side.

(6) The organic EL display device according to any one of the above (3) to (5), in which a wall face and a bottom face of the second separation groove are covered by the first conductive layer, and the second separation groove is embedded by the second electrode.

(7) The organic EL display device according to any one of the above (1) to (6), further including a high resistance layer that is arranged between the organic layer and the second electrode.

(8) The organic EL display device according to any one of the above (1) to (7), in which the first insulating layer and the second insulating layer are organic insulating layers, and the third insulating layer is an inorganic insulating layer.

(9) The organic EL display device according to any one of the above (1) to (8), in which a seal material is arranged in an end portion of the substrate.

(10) The organic EL display device according to any one of the above (2) to (9), in which the peripheral circuit is formed on a lower layer side of the third insulating layer on the substrate.

(11) The organic EL display device according to any one of the above (1) to (10), in which the light-emitting device is arranged on the substrate in order of a positive hole injection layer, a positive hole transport layer, the light-emitting layer, an electron transport layer, and an electron injection layer, from the first electrode side.

(12) The organic EL display device according to any one of the above (1) to (10), in which the light-emitting device is arranged on the substrate in order of a positive hole injection layer, a positive hole transport layer, the light-emitting layer, an electron transport layer, an electron injection layer, a charge generation layer, the positive hole injection layer, the positive hole transport layer, the light-emitting layer, the electron transport layer, and the electron injection layer, from the first electrode side.

(13) The organic EL display device according to any one of the above (1) to (12), in which the plurality of pixels are made up of red pixels, green pixels, and blue pixels, or red pixels, green pixels, blue pixels, and white pixels.

(14) An electronic apparatus including an organic EL display device, in which the organic EL display device includes a display region where a plurality of pixels having a light-emitting device which is stacked respectively in order of an organic layer including a first electrode and a light-emitting layer, and a second electrode from a substrate side, are arranged, a peripheral region that is arranged on an outer edge side of the display region, and has a peripheral circuit, a first insulating layer of a lower layer side and a second insulating layer of an upper layer side that are arranged so as to be extended to the peripheral region from the display region, a first separation groove that is arranged in the first insulating layer between the display region and the peripheral region, a first conductive layer that is arranged on the first insulating layer of the peripheral region, through a bottom portion from a side face of the first separation groove, a first covering portion where at least an end face of the second insulating layer is covered by the organic layer or the second electrode, a sealing portion that is arranged on an outer edge side of the first covering portion, and is configured by stacking the first conductive layer and the second electrode, and a second covering portion where an end face of an outer edge side of the first insulating layer which is separated from the peripheral region side by the first separation groove, is covered by the first conductive layer.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display device comprising:
    a display region including a plurality of pixels respectively having a light-emitting device which is stacked respectively in order of an organic layer including a first electrode and a light-emitting layer, and a second electrode from a substrate side;
    a peripheral region that is arranged on an outer edge side of the display region, and has a peripheral circuit;
    a first insulating layer of a lower layer side and a second insulating layer of an upper layer side that are arranged so as to be extended to the peripheral region from the display region;
    a first separation groove that is arranged in the first insulating layer between the display region and the peripheral region;
    a first conductive layer that is arranged on the first insulating layer of the peripheral region, through a bottom portion from a side face of the first separation groove;
    a first covering portion where at least an end face of the second insulating layer is covered by the organic layer or the second electrode;
    a sealing portion that is arranged on an outer edge side of the first covering portion, and is configured by stacking the first conductive layer and the second electrode;
    a second covering portion where an end face of an outer edge side of the first insulating layer which is separated from the peripheral region side by the first separation groove, is covered by the first conductive layer;
    a second conductive layer that is arranged between the substrate and the first insulating layer;
    a third insulating layer that is arranged between the second conductive layer and the first insulating layer, the third insulating layer being separated by the first separation groove with the first insulating layer; and
    a connection portion that is arranged in the bottom portion of the first separation groove, the connection portion includes a stack having the first conductive layer and the second conductive layer.

2. The organic EL display device according to claim 1, wherein the second electrode and the second conductive layer are electrically connected through the first conductive layer.

3. The organic EL display device according to claim 1, wherein the first electrode and the first conductive layer are formed by the same process.

4. The organic EL display device according to claim 1, further comprising:
    a second separation groove that is arranged in the peripheral region, and separates the first insulating layer from an inner region side and an outer region side.

5. The organic EL display device according to claim 4, wherein a wall face and a bottom face of the second separation groove are covered by the first conductive layer, and the second separation groove is embedded by the second electrode.

6. The organic EL display device according to claim 1, further comprising:
    a high resistance layer that is arranged between the organic layer and the second electrode.

7. The organic EL display device according to claim 1, wherein the first insulating layer and the second insulating layer are organic insulating layers, and the third insulating layer is an inorganic insulating layer.

8. The organic EL display device according to claim 1, wherein a seal material is arranged in an end portion of the substrate.

9. The organic EL display device according to claim 1, wherein the peripheral circuit is formed on a lower layer side of the third insulating layer on the substrate.

10. The organic EL display device according to claim 1, wherein the light-emitting device is arranged on the substrate in order of a positive hole injection layer, a positive hole transport layer, the light-emitting layer, an electron transport layer, and an electron injection layer, from the first electrode side.

11. The organic EL display device according to claim 1, wherein the light-emitting device is arranged on the substrate in order of a positive hole injection layer, a positive hole transport layer, the light-emitting layer, an electron transport layer, an electron injection layer, a charge generation layer, the positive hole injection layer, the positive hole transport layer, the light-emitting layer, the electron transport layer, and the electron injection layer, from the first electrode side.

12. The organic EL display device according to claim 1, wherein the plurality of pixels are made up of red pixels, green pixels, and blue pixels, or red pixels, green pixels, blue pixels, and white pixels.

13. An electronic apparatus comprising:
    an organic EL display device,
    wherein the organic EL display device includes a display region including a plurality of pixels respectively having a light-emitting device which is stacked respectively in order of an organic layer including a first electrode and a light-emitting layer, and a second electrode from a substrate side,
    a peripheral region that is arranged on an outer edge side of the display region, and has a peripheral circuit,
    a first insulating layer of a lower layer side and a second insulating layer of an upper layer side that are arranged so as to be extended to the peripheral region from the display region,
    a first separation groove that is arranged in the first insulating layer between the display region and the peripheral region, a first conductive layer that is arranged on the first insulating layer of the peripheral region, through a bottom portion from a side face of the first separation groove, a first covering portion where at least an end face of the second insulating layer is covered by the organic layer or the second electrode, a sealing portion that is arranged on an outer edge side of the first covering portion, and is configured by stacking the first conductive layer and the second electrode, a second covering portion where an end face of an outer edge side of the first insulating layer which is separated from the peripheral region side by the first separation groove, is covered by the first conductive layer, a second conductive layer that is arranged between the substrate and the first insulating layer, a third insulating layer that is arranged between the second conductive layer and the first insulating layer, the third insulating layer being separated by the first separation groove with the first insulating layer, and a connection portion that is arranged in the bottom portion of the first separation groove, the connection portion includes a stack having the first conductive layer and the second conductive layer.

14. The electronic apparatus according to claim 13, wherein the second electrode and the second conductive layer are electrically connected through the first conductive layer.

15. The electronic apparatus according to claim 13, wherein the first electrode and the first conductive layer are formed by the same process.

16. The electronic apparatus according to claim 13, further comprising:
a second separation groove that is arranged in the peripheral region, and separates the first insulating layer from an inner region side and an outer region side.

17. The electronic apparatus according to claim 16, wherein a wall face and a bottom face of the second separation groove are covered by the first conductive layer, and the second separation groove is embedded by the second electrode.

18. The electronic apparatus according to claim 13, further comprising:
a high resistance layer that is arranged between the organic layer and the second electrode.

19. The electronic apparatus according to claim 13, wherein the first insulating layer and the second insulating layer are organic insulating layers, and the third insulating layer is an inorganic insulating layer.

20. The electronic apparatus according to claim 13, wherein a seal material is arranged in an end portion of the substrate.

* * * * *